US012652938B2

(12) United States Patent
Kang et al.

(10) Patent No.: US 12,652,938 B2
(45) Date of Patent: Jun. 9, 2026

(54) ORGANIC LIGHT-EMITTING DIODE DISPLAY DEVICE AND METHOD OF MANUFACTURING THE SAME

(71) Applicant: LG Display Co., Ltd., Seoul (KR)

(72) Inventors: Yeon-Suk Kang, Paju-si (KR);
Pu-Reum Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 454 days.

(21) Appl. No.: 18/484,892

(22) Filed: Oct. 11, 2023

(65) Prior Publication Data

US 2024/0215409 A1     Jun. 27, 2024

(30) Foreign Application Priority Data

Dec. 27, 2022     (KR) ........................ 10-2022-0186223

(51) Int. Cl.
H10K 59/80          (2023.01)
H10K 59/38          (2023.01)
(52) U.S. Cl.
CPC ........... H10K 59/879 (2023.02); H10K 59/38 (2023.02); H10K 59/8792 (2023.02)

(58) Field of Classification Search
CPC .. H10K 59/879; H10K 59/38; H10K 59/8792; H10K 50/858; H10K 50/865; H10K 50/844; H10K 71/00
See application file for complete search history.

(56) References Cited

FOREIGN PATENT DOCUMENTS

CN          117042532 A  * 11/2023   ............. H10K 59/38
KR        20160027608 A     3/2016
KR        20210155399 A    12/2021

* cited by examiner

*Primary Examiner* — Anne M Hines
*Assistant Examiner* — Jose M Diaz
(74) *Attorney, Agent, or Firm* — Seed Intellectual Property Law Group LLP

(57)          ABSTRACT

An organic light-emitting diode display device can include a substrate providing with a plurality of sub-pixels. The device includes a light-emitting diode disposed at each of the plurality of sub-pixels over the substrate. The device includes a color filter over the light-emitting diode. The device includes a lens layer over the color filter. The device includes an overcoat layer over the lens layer. A concave portion is provided between adjacent color filters. The lens layer includes a convex lens portion over the color filter and a concave lens portion over the concave portion.

23 Claims, 20 Drawing Sheets

ORGANIC LIGHT-EMITTING DIODE DISPLAY DEVICE AND METHOD OF MANUFACTURING THE SAME

CROSS-REFERENCE TO RELATED APPLICATION

The present application claims priority to Korean Patent Application No. 10-2022-0186223 filed in the Republic of Korea on Dec. 27, 2022, the entire contents of which are hereby expressly incorporated by reference into the present application.

BACKGROUND

Technical Field

The present disclosure relates to a display device, and more particularly, to an organic light-emitting diode display device with improved reproducibility and a method of manufacturing the same.

Description of the Related Art

As the information society progresses, a demand for different types of display devices increases, and flat panel display devices (FPD) such as liquid crystal display devices (LCD) and organic light-emitting diode display devices (OLED) have been developed and applied to various fields.

Among the flat panel display devices, organic light-emitting diode display devices, which are also referred to as organic electroluminescent display devices, emit light due to the radiative recombination of an exciton. The exciton is formed from an electron and a hole by injecting charges into a light-emitting layer between a cathode for injecting electrons and an anode for injecting holes in a light-emitting diode.

The organic light-emitting diode display device can be formed over a flexible substrate, such as plastic, and offers various advantages and improved properties. For instance, because it is self-luminous, the organic light-emitting diode display device has an excellent contrast ratio and an ultra-thin thickness, and has a response time of several micro seconds. As such, there are advantages in displaying moving images and videos without delays using the organic light-emitting diode display device.

Additionally, the organic light-emitting diode display device has a wide viewing angle and is stable under low temperatures. Further, since the organic light-emitting diode display device is generally driven by a low voltage of direct current (DC) (e.g., 5V to 15V), it is easy to design and manufacture the driving circuits of the organic light-emitting display device.

BRIEF SUMMARY

Recently, as the organic light-emitting diode display device is applied to various fields, a display device having high resolution is required. In order to implement such a high resolution, more sub-pixels are provided within the same area. Accordingly, the area of each sub-pixel is reduced, and a distance between adjacent sub-pixels is also decreased.

This decrease in the distance between adjacent sub-pixels causes a lateral leakage current between adjacent sub-pixels. Due to this technical problem, unwanted sub-pixels emit light, which lowers the color reproducibility of the display device in the related art. Accordingly, various embodiments of the present disclosure provide an organic light-emitting diode display device and a method of manufacturing the same that substantially obviate one or more of the limitations and disadvantages in the related art including the technical problem described above.

More specifically, various embodiments of the present disclosure provide an organic light-emitting diode display device capable of reducing or minimizing a lateral leakage current between adjacent sub-pixels and a method of manufacturing the same.

various embodiments of the present disclosure provide an organic light-emitting diode display device capable of reducing or minimizing abnormal emission in a non-emission area and a method of manufacturing the same.

Additional features and aspects will be set forth in the description that follows, and in part will be apparent from the description, or can be learned by practice of the present disclosure provided herein. Other features and aspects of the inventive concepts can be realized and attained by the structure particularly pointed out in the written description, or derivable therefrom, and the claims hereof as well as the appended drawings.

To achieve these and other aspects of the present disclosure, as embodied and broadly described herein, an organic light-emitting diode display device includes a substrate providing with a plurality of sub-pixels; a light-emitting diode disposed at each of the plurality of sub-pixels over the substrate; a color filter over the light-emitting diode; a lens layer over the color filter; and an overcoat layer over the lens layer, wherein a concave portion is provided between adjacent color filters, and wherein the lens layer includes a convex lens portion over the color filter and a concave lens portion over the concave portion.

In another aspect, a method of manufacturing an organic light-emitting diode display device includes forming a light-emitting diode at each of a plurality of sub-pixels provided over a substrate; forming a color filter over the light-emitting diode; forming a lens layer over the color filter; and forming an overcoat layer over the lens layer, wherein forming the color filter includes forming a concave portion between adjacent color filters, and wherein forming the lens layer includes forming a convex lens portion over the color filter and forming a concave lens portion over the concave portion.

It is to be understood that both the foregoing general description and the following detailed description are examples and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION OF THE EMBODIMENTS

Figure 1:
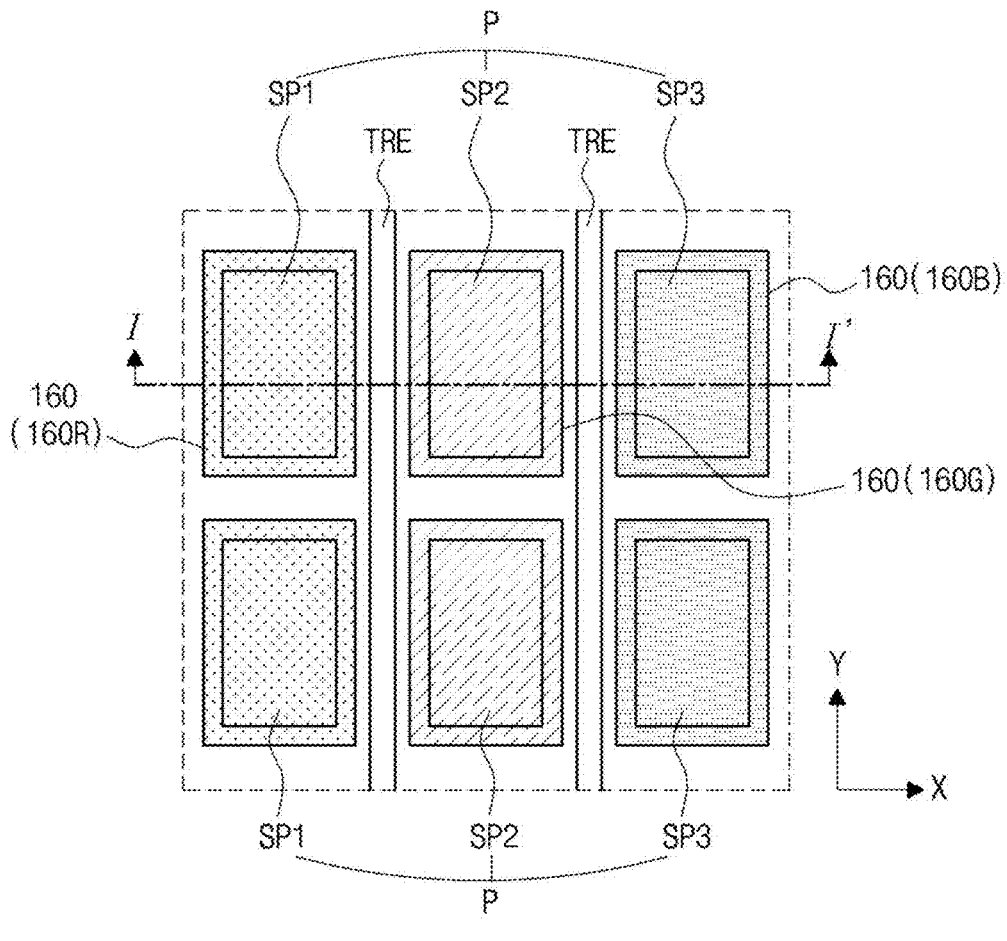
FIG. 1 is a plan view schematically illustrating an organic light-emitting diode display device according to an embodiment of the present disclosure.

Reference will now be made in detail to embodiments, examples of which are illustrated in the accompanying drawings. The same or like reference numbers may be used throughout the drawings to refer to the same or like parts.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Hereinafter, an organic light-emitting diode display device and a method of manufacturing the same according to embodiments of the present disclosure will be described in detail with reference to the accompanying drawings.

FIG. 1 is a plan view schematically illustrating an organic light-emitting diode display device according to an embodiment of the present disclosure.

In FIG. 1, the organic light-emitting diode display device according to the embodiment of the present disclosure can include a plurality of pixels P arranged in a matrix form along a first direction, which is an X direction, and a second direction, which is a Y direction. Each pixel P can include a plurality of sub-pixels SP1, SP2, and SP3. Although only two pixels P arranged along the second direction are shown in FIG. 1, the pixels P having the same configuration can also be arranged along the first direction.

One pixel P can include first, second, and third sub-pixels SP1, SP2, and SP3. For example, the first, second, and third sub-pixels SP1, SP2, and SP3 can be red, green, and blue sub-pixels, respectively. However, embodiments of the present disclosure are not limited thereto. Alternatively, the number of sub-pixels included in one pixel P can vary. For example, one pixel P can include red, green, blue, and white sub-pixels.

A color filter 160 (also referred to as a color filter layer 160) can be provided at each of the first, second, and third sub-pixels SP1, SP2, and SP3. The color filter 160 can include first, second, and third color filters 160R, 160G, and 160B, which are patterned to correspond to the first, second, and third sub-pixels SP1, SP2, and SP3, respectively. For example, the first, second, and third color filters 160R, 160G, and 160B can be red, green, and blue color filters, respectively.

Here, at least one thin film transistor and a light-emitting diode can be provided at each of the first, second, and third sub-pixels SP1, SP2, and SP3. In addition, lenses can be further provided at the first, second, and third sub-pixels SP1, SP2, and SP3 to correspond to the first, second, and third color filters 160R, 160G, and 160B, respectively, and this will be described in detail later.

A trench TRE can be provided between two sub-pixels SP1, SP2, and SP3 adjacent to each other along the first direction. The trench TRE can be extended along the second direction.

The trench TRE may not be provided between two sub-pixels adjacent to each other along the second direction, that is, between two first sub-pixels SP1, between two second sub-pixels SP2, and between two third sub-pixels SP3. However, embodiments of the present disclosure are not limited thereto. Alternatively, the trench TRE can be provided between two sub-pixels SP1, SP2, and SP3 adjacent to each other along the second direction.

A cross-sectional structure of the organic light-emitting diode display device according to the embodiment of the present disclosure will be described.

Figure 2:
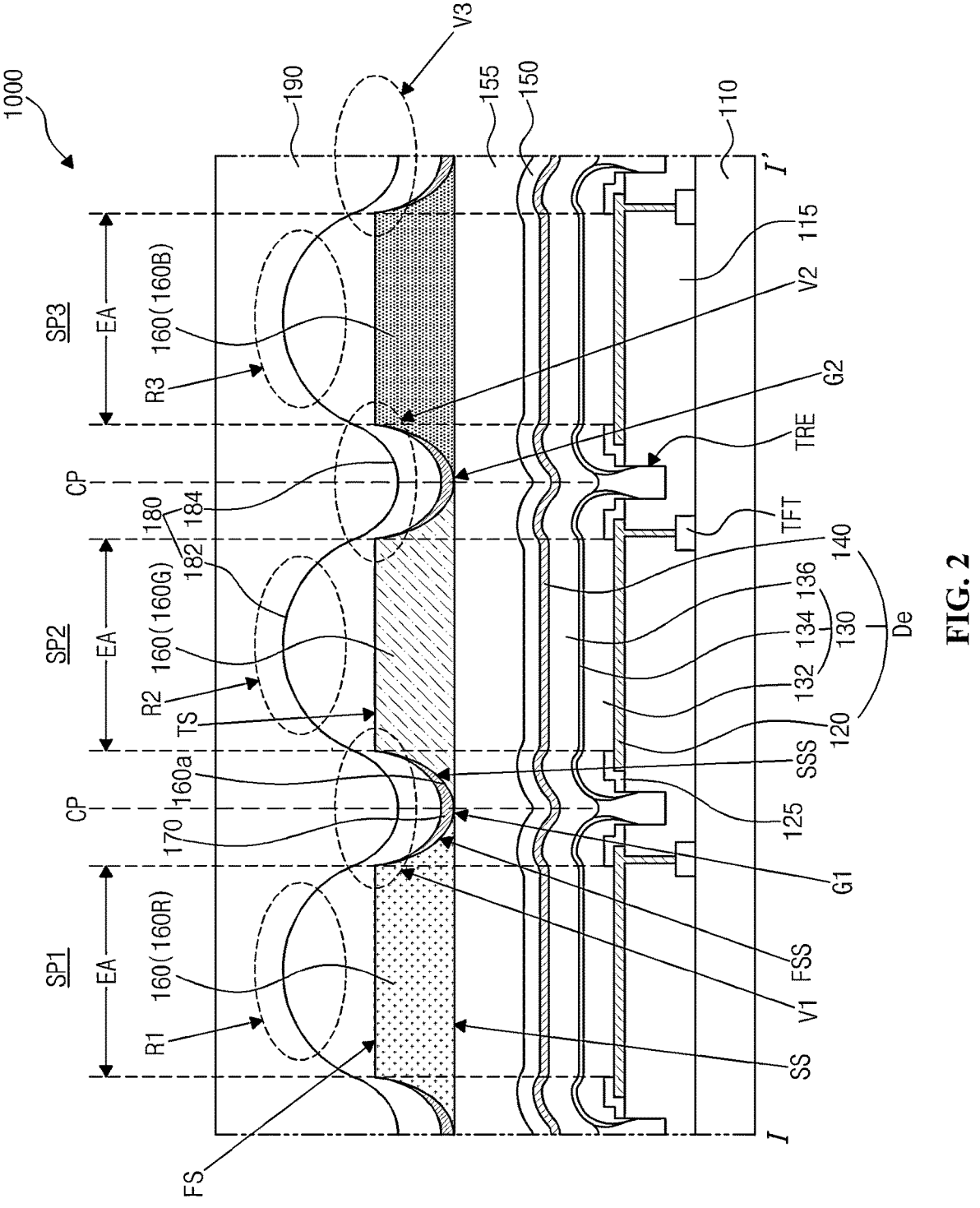
FIG. 2 is a cross-sectional view of an organic light-emitting diode display device according to a first embodiment of the present disclosure.

FIG. 2 is a cross-sectional view of an organic light-emitting diode display device according to a first embodiment of the present disclosure and shows a cross-section taken along the line I-I' of FIG. 1. Here, an organic light-emitting diode display device 1000 will be described as an example of a top emission type.

In FIG. 2, an organic light-emitting diode display device 1000 of the first embodiment of the present disclosure can include a plurality of sub-pixels, for example, first, second, and third sub-pixels SP1, SP2, and SP3. Each of the first, second, and third sub-pixels SP1, SP2, and SP3 can include a thin film transistor TFT and a light-emitting diode De.

Specifically, the thin film transistor TFT can be disposed in each of the first, second, and third sub-pixels SP1, SP2, and SP3 on a substrate 110.

Here, the substrate 110 can be formed of a semiconductor material. For example, the substrate 110 can be a wafer formed of single crystal silicon. However, embodiments of the present disclosure are not limited thereto. Alternatively, the substrate 110 can be formed of an insulating material such as glass or plastic.

The thin film transistor TFT can be a driving transistor connected to the light-emitting diode De. In addition, at least one transistor, at least one signal line, and at least one electrode, which can be connected to the driving transistor, can be further provided on the substrate 110.

For example, a switching transistor, a sensing transistor, a storage capacitor, a gate line, a data line, a power line, a sensing line and/or a reference line can be further provided on the substrate 110.

The switching transistor can be connected to the gate line, the data line, and the driving transistor and can be switched according to a gate signal of the gate line to thereby transmit a data signal of the data line to the driving transistor.

The driving transistor can be connected to the switching transistor, the power line, and the light-emitting diode De and can be switched according to the data signal transmitted from the switching transistor to thereby transmit a current according to a high potential voltage of the power line to the light-emitting diode De.

The sensing transistor can be connected to the driving transistor, the sensing line, and the reference line and can be switched according to a sensing signal of the sensing line to thereby transmit a reference voltage of the reference line to the driving transistor or detect a voltage of the driving transistor.

The storage capacitor can be connected to the switching transistor and the driving transistor and can serve to maintain the data signal transmitted from the switching transistor for one frame.

Next, an interlayer insulation layer 115 can be provided on the thin film transistor TFT. The interlayer insulation layer 115 can be disposed over a substantially entire surface of the substrate 110.

The interlayer insulation layer 115 can be formed as a single layer or multiple layers. For example, the interlayer insulation layer 115 can be formed of an inorganic insulating material such as silicon oxide (SiOx) or silicon nitride (SiNx). However, embodiments of the present disclosure are not limited thereto. Alternatively, the interlayer insulation layer 115 can be formed of an organic insulating material such as an acrylic resin, epoxy resin, phenol resin, polyamide resin, or polyimide resin.

A first electrode 120 can be provided in each of the first, second, and third sub-pixels SP1, SP2, and SP3 on the interlayer insulation layer 115. The first electrode 120 can be connected to the thin film transistor TFT through a contact hole provided in the interlayer insulation layer 115.

The first electrode 120 can include a conductive material having relatively high work function.

For example, as mentioned above, when the organic light-emitting diode display device 1000 according to the first embodiment of the present disclosure is a top emission type, the first electrode 120 can be formed as a structure having relatively high reflectance such as a triple-layer structure of titanium, aluminum, and titanium (Ti/Al/Ti), a triple-layer structure of indium tin oxide, aluminum, and indium tin oxide (ITO/Al/ITO), a triple-layer structure of indium tin oxide, silver, and indium tin oxide (ITO/Ag/ITO), or a triple-layer structure of indium tin oxide, silver alloy, and indium tin oxide (ITO/Ag alloy/ITO). Here, the silver alloy can be an alloy of silver-palladium-copper (APC).

Alternatively, the first electrode 120 can include a transparent electrode layer formed of a transparent conductive oxide (TCO) such as indium tin oxide (ITO) or indium zinc oxide (IZO), and a reflective layer can be disposed under the transparent electrode layer. In this case, distances between the transparent electrode layer and the reflective layer can be different from each other in the first, second, and third sub-pixels SP1, SP2, and SP3. For example, the distance between the transparent electrode layer and the reflective layer in the second sub-pixel SP2 can be smaller than the distance between the transparent electrode layer and the reflective layer in the first sub-pixel SP1 and greater than the distance between the transparent electrode layer and the reflective layer in the third sub-pixel SP3.

A bank 125 can be disposed on the first electrode 120. The bank 125 can cover edges of the first electrode 120 and have an opening exposing a central portion of the first electrode 120. A portion corresponding to the opening of the bank 125, that is, the portion of the first electrode 120 exposed by the bank 125 can be defined as an emission area EA. A portion except for the emission area EA can be defined as a non-emission area.

For example, the bank 125 can be formed of an inorganic insulating material such as silicon oxide (SiOx) or silicon nitride (SiNx). However, embodiments of the present disclosure are not limited thereto. Alternatively, the bank 125 can be formed of an organic insulating material such as an acrylic resin, epoxy resin, phenol resin, polyamide resin, or polyimide resin.

The bank 125 can be formed as a single layer or multiple layers.

Meanwhile, a trench TRE can be formed in the bank 125 and the interlayer insulation layer 115 between adjacent sub-pixels SP1, SP2, and SP3, that is, at a boundary of the first, second, and third sub-pixels SP1, SP2, and SP3.

In the first embodiment of the present disclosure, the trench TRE can be formed in both the interlayer insulation layer 115 and the bank 125 as an example, but the trench TRE can be formed only in the interlayer insulation layer 115. Namely, in other embodiments, the bank 125 between the adjacent sub-pixels SP1, SP2, and SP3 may not be disconnected and be continuously connected to cover the trench TRE.

The trench TRE can separate a light-emitting layer 130 of the adjacent sub-pixels SP1, SP2, and SP3 in a subsequent process from each other to thereby reduce or minimize a lateral leakage current.

Specifically, when the trench TRE is not formed, first and second stacks 132 and 136 and a charge generation layer 134 can be connected to each other between the adjacent sub-pixels SP1, SP2, and SP3, so that a lateral leakage current can be generated. The lateral leakage current may cause undesired sub-pixels SP1, SP2, and SP3 to emit light and decrease the color reproducibility.

The decrease in the color reproducibility may be greater when the lateral leakage current occurs between the sub-pixels emitting light of different colors than when the lateral leakage current occurs between the sub-pixels emitting light of the same color.

Accordingly, in the organic light-emitting diode display device 1000 according to the first embodiment of the present disclosure, to reduce or minimize the lateral leakage current between the first, second, and third sub-pixels SP1, SP2, and SP3 emitting light of different colors, the trench TRE can be disposed between the first, second, and third sub-pixels SP1, SP2, and SP3 emitting light of different colors. Here, the first stack 132 and the charge generation layer 134 between the adjacent sub-pixels SP1, SP2, and SP3 can be separated by the trench TRE, while the second stack 136 between the adjacent sub-pixels SP1, SP2, and SP3 can be connected to each other without being separated. Alternatively, the first stack 132, the charge generation layer 134, and the second stack 134 between the adjacent sub-pixels SP1, SP2, and SP3 can all be separated from each other by the trench TRE.

Meanwhile, the trench TRE may not be provided between the first, second, and third sub-pixels SP1, SP2, and SP3 emitting light of the same color.

For example, when the organic light-emitting diode display device 1000 according to the first embodiment of the present disclosure is a stripe type, as shown in FIG. 1, the first, second, and third sub-pixels SP1, SP2, and SP3 of different colors can be sequentially repeatedly arranged along the first direction, and the first sub-pixels SP1, second sub-pixels SP2, and third sub-pixels SP3 of the same color can be arranged along the second direction. In this case, the trench TRE can be provided to have a line shape in the second direction between the sub-pixels SP1, SP2, and SP3 emitting light of different colors adjacent to each other along the first direction of FIG. 1 and may not be provided between the sub-pixels SP1, SP2, and SP3 emitting light of the same color adjacent to each other along the second direction of FIG. 1.

Next, the light-emitting layer 130 can be disposed on the first electrode 120 exposed through the opening of the bank 125 and the bank 125. The light-emitting layer 130 can include the first stack 132, the charge generation layer 134, and the second stack 136.

The first stack 132 can include at least one hole injecting layer (HIL), at least one hole transporting layer (HTL), at least one emitting material layer (EML), and at least one electron transporting layer (ETL). The emitting material layer (EML) of the first stack 132 can emit one of red light, green light, blue light, and yellow light.

The charge generation layer (CGL) 134 can include a negative type charge generation layer (N-type CGL) for providing an electron to the first stack 132 and a positive type charge generation layer (P-type CGL) for providing a hole to the second stack 136.

The second stack 136 can include at least one hole transporting layer (HTL), at least one emitting material layer (EML), at least one electron transporting layer (ETL), and at least one electron injecting layer (EIL). The emitting material layer (EML) of the second stack 136 can emit one of red light, green light, blue light, and yellow light.

Here, the emitting material layer (EML) of the second stack 136 can emit light of a different color from the emitting material layer (EML) of the first stack 132. For example, the emitting material layer (EML) of the first stack 132 can emit blue light, and the emitting material layer (EML) of the second stack 136 can emit yellow light. Alternatively, the emitting material layer (EML) of the first stack 132 can emit blue light, and the emitting material layer (EML) of the second stack 136 can emit red light and green light.

As described above, at least one including the charge generation layer 134 of the first stack 132, the charge generation layer 134, and the second stack 136 of the light-emitting layer 130 can be disconnected over the trench 134 due to a step difference of the trench TRE and be spaced apart for each of the first, second, and third sub-pixels SP1, SP2, and SP3 without contacting each other.

For example, the first stack 132 and the charge generation layer 134 can be spaced apart for each of the first, second, and third sub-pixels SP1, SP2, and SP3. In this case, the first stack 132 and the charge generation layer 134 can be thinner as it approaches the substrate 110 and then be cut off over the trench TRE. Meanwhile, the same materials as the first stack 132 and the charge generation layer 134 can be stacked in the trench TRE.

As described above, in the organic light-emitting diode display device 1000 according to the first embodiment of the present disclosure, the first stack 132 and the charge generation layer 134 can be separated and spaced apart for each of the first, second, and third sub-pixels SP1, SP2, and SP3 over the trench TRE, thereby reducing or minimizing the lateral leakage current between the first, second, and third sub-pixels SP1, SP2, and SP3 emitting light of different colors.

A second electrode 140 can be provided on the light-emitting layer 130. The second electrode 140 can be disposed over a substantially entire surface of the substrate 110.

The first electrode 120, the light-emitting layer 130, and the second electrode 140 can constitute the light-emitting diode De. Here, the first electrode 120 can serve as an anode, and the second electrode 140 can serve as a cathode. However, embodiments of the present disclosure are not limited thereto. Alternatively, the first electrode 120 can serve as a cathode, and the second electrode 140 can serve as an anode.

The second electrode 140 may not be separated over the trench TRE and can be connected to each other between the first, second, and third sub-pixels SP1, SP2, and SP3. Alternatively, the second electrode 140 can be separated over the trench TRE and spaced apart for each of the first, second, and third sub-pixels SP1, SP2, and SP3.

The second electrode 140 can be formed of a transparent conductive material, a semi-transmissive material, or a metal material having reflectance. The second electrode 140 can include a conductive material having relatively low work function.

For example, as stated above, when the organic light-emitting diode display device 1000 according to the first embodiment of the present disclosure is a top emission type, the second electrode 140 can be formed of a transparent conductive oxide (TCO) such as indium tin oxide (ITO) indium or indium zinc oxide (IZO) or a semi-transmissive metal material such as magnesium (Mg), silver (Ag), or an alloy of magnesium and silver (MgAg) capable of transmitting light.

A passivation layer 150 can be disposed on the second electrode 140, and an encapsulation layer 155 can be disposed on the passivation layer 150.

For example, the passivation layer 150 can be formed of an inorganic insulating material such as aluminum oxide (AlOx), silicon oxide (SiOx), or silicon nitride (SiNx).

The encapsulation layer 155 can be formed as a single layer of an inorganic insulating material or an organic insulating material or as multiple layers of an inorganic insulating material and an organic insulating material. When the encapsulation layer 155 is formed as multiple layers, the encapsulation layer 155 can include an organic insulating material layer and an inorganic insulating material layer or an inorganic insulating material layer, an organic insulating material layer, and an inorganic insulating material layer sequentially disposed.

For example, the encapsulation layer 155 can include an inorganic insulating material such as silicon oxide (SiOx) or silicon nitride (SiNx) or an organic insulating material such as acrylic resin or epoxy resin.

The passivation layer 150 and the encapsulation layer 155 can block external moisture and oxygen.

Next, a color filter 160 can be disposed on the encapsulation layer 155. The color filter 160 can be disposed to correspond to the emission area EA and can include first, second, and third color filters 160R, 160G, and 160B corresponding to the first, second, and third sub-pixels SP1, SP2, and SP3, respectively. The first, second, and third color filters 160R, 160G, and 160B can be red, green, and blue color filters, respectively. However, embodiments of the present disclosure are not limited thereto.

Each of the first, second, and third color filters 160R, 160G, and 160B can have a lower surface contacting the encapsulation layer 155 and an upper surface having a smaller width than the lower surface. The width of the upper surface can be greater than or equal to a width of the opening of the bank 125. That is, the width of the upper surface can be greater than or equal to a width of the emission area EA. A distance between the upper surfaces of the adjacent color filters 160R, 160G, and 160B, that is, a distance between the adjacent emission areas EA can be equal to or less than about 1 μm, but embodiments of the present disclosure are not limited thereto.

Each of the first, second, and third color filters 160R, 160G, and 160B can have a side surface at least partially inclined with respect to the substrate 110. Accordingly, a concave portion 160a, which is formed by the side surfaces of the adjacent color filters 160R, 160G, and 160B, can be provided between the adjacent the color filters 160R, 160G, and 160B. That is, the concave portion 160a can be disposed to correspond to the non-emission area. The side surface of each of the first, second, and third color filters 160R, 160G, and 160B can be curved, and the concave portion 160a can have a shape of a concave lens.

Namely, the concave portion 160a can be provided between the adjacent color filters 160R, 160G, and 160B of different colors along the first direction of FIG. 1. In addition, the concave portion 160a can also be provided between the adjacent color filters 160R, 160G, and 160B of the same color along the second direction of FIG. 1.

A light absorption layer 170 having a relatively high absorption rate and a relatively low transmittance can be disposed on the concave portion 160a. The light absorption layer 170 can be formed along the shape of the concave portion 160a, and an upper surface of the light absorption layer 170 can have a concave shape toward the substrate 110. The light absorption layer 170 can be provided between the adjacent color filters 160R, 160G, and 160B of different colors along the first direction of FIG. 1 and between the adjacent color filters 160R, 160G, and 160B of the same color along the second direction of FIG. 1. The light absorption layer 170 can be disposed in a lattice shape.

The light absorption layer 170 can be an inorganic layer formed of an inorganic material. In this case, the light absorption layer 170 can be formed of a metal material having a transmittance of 50% or less. For example, the light absorption layer 170 can be formed of chromium (Cr), titanium (Ti), molybdenum (Mo), cobalt (Co), nickel (Ni), or an alloy thereof. However, embodiments of the present disclosure are not limited thereto. Alternatively, the light absorption layer 170 can be an organic layer formed of an organic material.

A lens layer 180 can be disposed on the first, second, and third color filters 160R, 160G, and 160B and the light absorption layer 170. The lens layer 180 can have a convex lens portion 182 and a concave lens portion 184.

The convex lens portion 182 can correspond to the emission area EA and can be disposed on the color filter 160. The convex lens portion 182 can be provided for each of the sub-pixels SP1, SP2, and SP3, and can have a substantially semicircular or semielliptical cross-section.

The concave lens portion 184 can correspond to the non-emission area between the emission areas EA and can be disposed on the light absorption layer 170. That is, the concave lens portion 184 can correspond to the concave portion 160a and can be disposed on the concave portion 160a.

The lens layer 180 can have a relatively refractive index. The refractive index of the lens layer 180 can be greater than or equal to the refractive index of the color filter 160.

An overcoat layer 190 can be disposed on the lens layer 180. The overcoat layer 190 can eliminate a step difference caused by the layers thereunder and can have a substantially flat upper surface.

The overcoat layer 190 can have a relatively low refractive index. The refractive index of the overcoat layer 190 can be smaller than the refractive index of the lens layer 180.

The difference between the refractive indexes of the lens layer 180 and the overcoat layer 190 can be about 2 or more.

For example, the refractive index of the lens layer 180 can be 1.55 to 1.8, and the refractive index of the overcoat layer 190 can be 1.35 to 1.6. However, embodiments of the present disclosure are not limited thereto.

As described above, in the organic light-emitting diode display device 1000 according to the first embodiment of the present disclosure, by disposing the trench TRE between the adjacent first, second, and third sub-pixels SP1, SP2, and SP3 of different colors, the first stack 132 and the charge generation layer 134 can be separated, thereby reducing or minimizing the lateral leakage current.

In addition, by placing the convex lens portion 182 having the relatively high refractive index on each of the color filters 160R, 160G, and 160B, the light from the light-emitting diode De can be output toward the front of the display device, thereby improving the light efficiency.

Further, by providing the concave portion 160a between the adjacent color filters 160R, 160G, and 160B of the different colors and between the adjacent color filters 160R, 160G, and 160B of the same color and disposing the concave lens portion 184 having the relatively high refractive index on the concave portion 160a, the direction of the light directed to the neighboring sub-pixels SP1, SP2, and SP3 through the non-emission area can be changed so that the light directed to the neighboring sub-pixels SP1, SP2, and SP3 cannot be output to the outside, thereby reducing or minimizing abnormal emission in the non-display area. Therefore, since the color shift according to the viewing angle can be prevented, the viewing angle can be improved, and the color reproducibility can be increased.

In this case, by further providing the light absorption layer 170 corresponding to the concave portion 160a, the light directed to the neighboring sub-pixels SP1, SP2, and SP3 through the non-emission area can be absorbed by the light absorption layer 170, thereby further improving the color reproducibility.

Meanwhile, in the first embodiment of FIG. 2, the light-emitting layer 130 can have a two-stack structure including the first stack 132, the charge generation layer 134, and the second stack 136 as an example, but in other embodiments, the light-emitting layer 130 can have a multi-stack structure including three or more stacks and two or more charge generation layers. In this case, two or more stacks and two or more charge generation layers can be separated by the trench TRE.

Referring to FIG. 2, the lens layer 180 may include a plurality of ridges and a plurality of valleys. In some embodiments, the ridges correspond to the convex portions of the lens layer 180 (e.g., convex lens portion 182) and the valleys correspond to the concave portions of the lens layer 180 (e.g., concave lens portion 184). As shown, the lens layer 180 may have like a wavy shape that includes ridges and valleys. For example, the plurality of valleys of the lens layer 180 includes a first valley V1, a second valley V2, and a third valley V3. Similarly, the plurality of ridges of the lens layer 180 includes a first ridge R1, a second ridge R2, and a third ridge R3. Here, the first valley V1 is between the first ridge R1 and the second ridge R2. The second valley V2 is between the second ridge R2 and the third ridge R3. The third valley V3 is between the third ridge R3 and a fourth ridge (not shown).

In FIG. 2, the first ridge R1 is disposed on the first color filter 160R, the second ridge R2 is disposed on the second color filter 160G, and the third ridge R3 is disposed on the third color filter 160B. On the other hand, the first valley V1 is disposed between a space between the first color filter 160R and the second color filter 160G, and the second valley V2 is disposed between a space between the third color filter 160B and the second color filter 160G. The space may also be referred to as a groove of the color filter layer 160. In some embodiments, the color filter layer 160 includes a plurality of grooves. Referring to FIG. 2, the plurality of grooves includes a first groove G1 between the first color filter 160R and the second color filter 160G, and a second groove G2 between the third color filter 160B and the second color filter 160G.

The first groove G1 has a first side surface FSS that is a side surface of the first color filter 160R and a second side surface SSS that is a side surface of the second color filter 160G. The light absorption layer 170 is disposed along the first side surface FSS of the first color filter 160R and the second side surface SSS of the second color filter 160G.

The first color filter 160R includes a first surface FS (e.g., an upper surface) and a second surface SS (e.g., a lower surface) opposite the first surface FS. The distance between the first surface FS and the second surface SS defines the thickness of the first color filter 160R. The second color filter 160G includes a third surface TS (e.g., an upper surface) and a second surface SS (e.g., a lower surface) opposite the third surface TS. Namely, the second surface SS of the color filter layer 160 is common to the first color filter 160R, the second color filter 160G, and the third color filter 160B. Similarly, the distance between the third surface TS and the second surface SS defines the thickness of the second color filter 160G. The light absorption layer 170 is disposed in a location between the first surface FS of the first color filter 160R and the third surface TS of the second color filter 160G.

The first groove G1 and the second groove G2 both have a center portion and the dotted line shown in FIG. 2 passes through the center CP of each groove. The light absorption layer 170 this is disposed in the first groove G1 has a thickness that gradually increases as the layer approaches or get closer to the center CP of the first groove G1. That is, at the portion where the light absorption layer 170 is the closest to the first surface FS of the first color filter 160R has the smallest thickness and the thickness of the light absorption layer 170 gradually increases as it extends towards the center CP of the first groove G1. The thickness of the light absorption layer 170 gradually decreases as it gets closer to the third surface TS of the second color filter 160R thereby forming a U-shape that is thickest at the center of the light absorption layer 170.

In addition, as shown, the first valley V1 overlaps with the trench TRE (e.g., the trench between SP1 and SP2) from a plan view. The second valley V2 overlaps with the trench TRE (e.g., the trench between SP3 and SP2) from a plan view. Similarly, the groove G1 overlaps with the trench TRE (e.g., the trench between SP1 and SP2) from a plan view and the groove G2 overlaps with the trench TRE (e.g., the trench between SP3 and SP2) from a plan view.

A method of manufacturing the organic light-emitting diode display device 1000 according to the first embodiment of the present disclosure will be described with reference to FIGS. 3A to 3J.

FIGS. 3A to 3J are schematic cross-sectional views of an organic light-emitting diode display device in steps of manufacturing the organic light-emitting diode display device according to the first embodiment of the present disclosure.

Figure 3A:
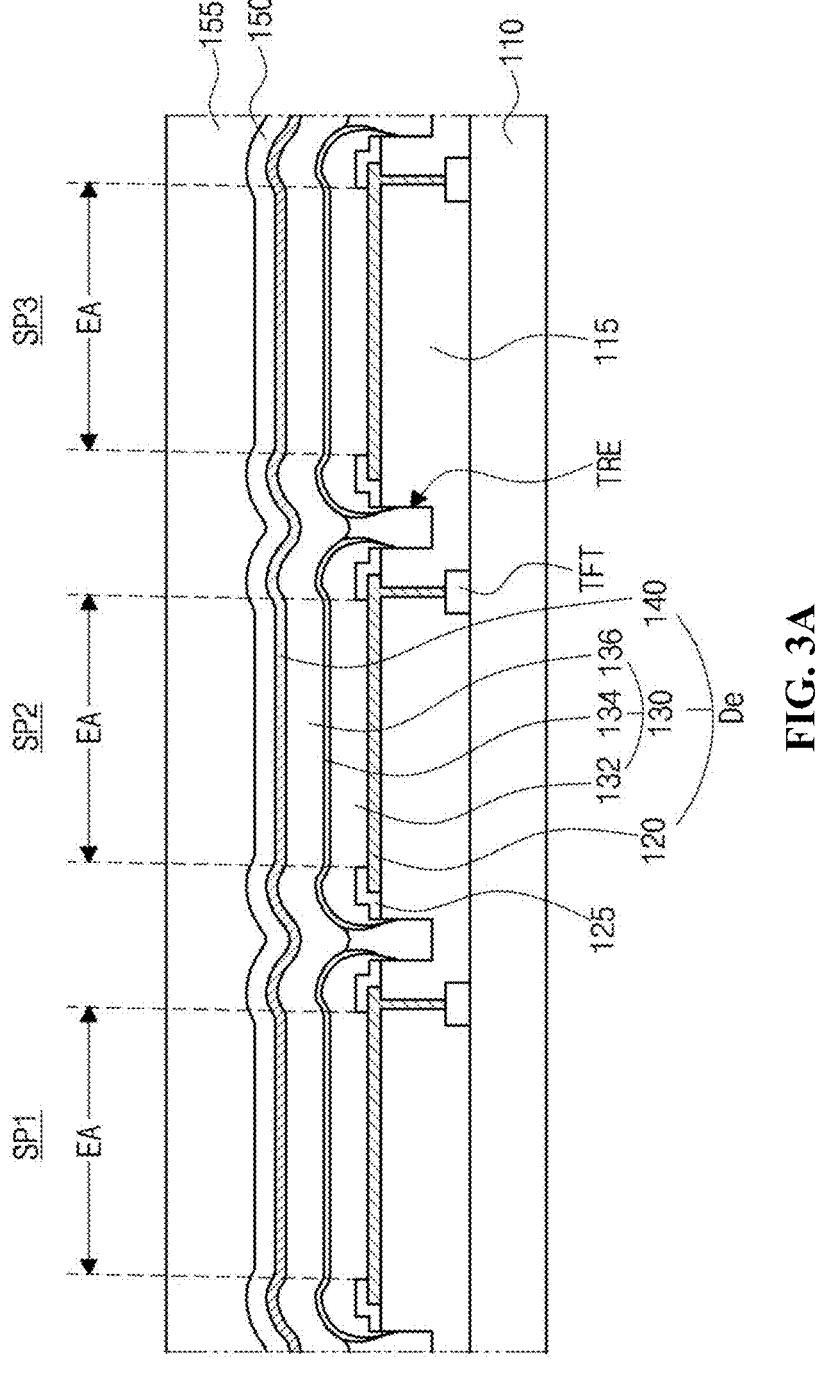
FIGS. 3A to 3J are schematic cross-sectional views of an organic light-emitting diode display device in steps of manufacturing the organic light-emitting diode display device according to a first embodiment of the present disclosure.

In FIG. 3A, the thin film transistor TFT can be formed in each of the first, second, and third sub-pixels SP1, SP2, and SP3 on the substrate 110, the interlayer insulation layer 115 can be formed on the thin film transistor TFT over the substantially entire surface of the substrate 110, and the contact hole exposing the thin film transistor TFT can be formed in the interlayer insulation layer 115.

Next, the first electrode 120 can be formed on the interlayer insulation layer 115 in each of the first, second, and third sub-pixels SP1, SP2, and SP3. The first electrode 120 can be connected to the thin film transistor TFT through the contact hole of the interlayer insulation layer 115.

Then, the bank 125 can be formed on the first electrode 120. The bank 125 can cover the edges of the first electrode and can have the opening exposing the central portion of the first electrode 120. The trench TRE can be formed between the adjacent first, second, and third sub-pixels SP1, SP2, and SP3 by etching the bank 125 and the interlayer insulation layer 115.

In the first embodiment of the present disclosure, it has been described that the trench TRE is formed after forming the bank 125, but embodiments of the present disclosure are not limited thereto. Alternatively, the trench TRE can be formed in the interlayer insulation layer 115, and then the first electrode 120 and the bank 125 can be formed.

Next, the first stack 132 and the charge generation layer 134 can be sequentially formed on the first electrode 120 exposed through the opening of the bank 125 and the bank 125. The first stack 132 and the charge generation layer 134 can be formed through a thermal evaporation process. However, embodiments of the present disclosure are not limited thereto. Alternatively, the first stack 132 and the charge generation layer 134 can be formed through a solution process such as a spin coating, an inkjet printing, or a screen printing.

The first stack 132 and the charge generation layer 134 can be separated by the trench TRE. Accordingly, the first stack 132 and the charge generation layer 134 of the adjacent sub-pixels SP1, SP2, and SP3 are not connected to each other, and the first stack 132 and the charge generation layer 134 can be separated for each of the sub-pixels SP1, SP2, and SP3. In this case, each of the first stack 132 and the charge generation layer 134 can be formed along a side wall of the trench TRE and be thinner on the side wall of the trench TRE as it approaches the substrate 110 and then be cut off.

Then, the second stack 136 and the second electrode 140 can be sequentially formed on the charge generation layer 134. The second stack 136 and the second electrode 140 can be formed through a thermal evaporation process. However, embodiments of the present disclosure are not limited thereto. Alternatively, the second stack 136 and the second electrode 140 can be formed through a solution process such as a spin coating, an inkjet printing, or a screen printing.

Here, the second stack 136 and the second electrode 140 of the adjacent sub-pixels SP1, SP2, and SP3 can be connected to each other without being separated. Alternatively, the second stack 136 and/or the second electrode 140 can be separated for each of the sub-pixels SP1, SP2, and SP3.

Next, the passivation layer 150 and the encapsulation layer 155 can be sequentially formed on the second electrode 140. In this case, the passivation layer 150 can be formed through a deposition process having excellent step coverage. Accordingly, the passivation layer 150 can be formed along the steps of the layers thereunder and can have a non-flat upper surface.

On the other hand, the encapsulation layer 155 can eliminate a step difference caused by the layers thereunder and can have a substantially flat upper surface. The encapsulation layer 155 can be formed through a solution process.

However, embodiments of the present disclosure are not limited thereto. Alternatively, the encapsulation layer 155 can be formed through a deposition process.

Figure 3B:
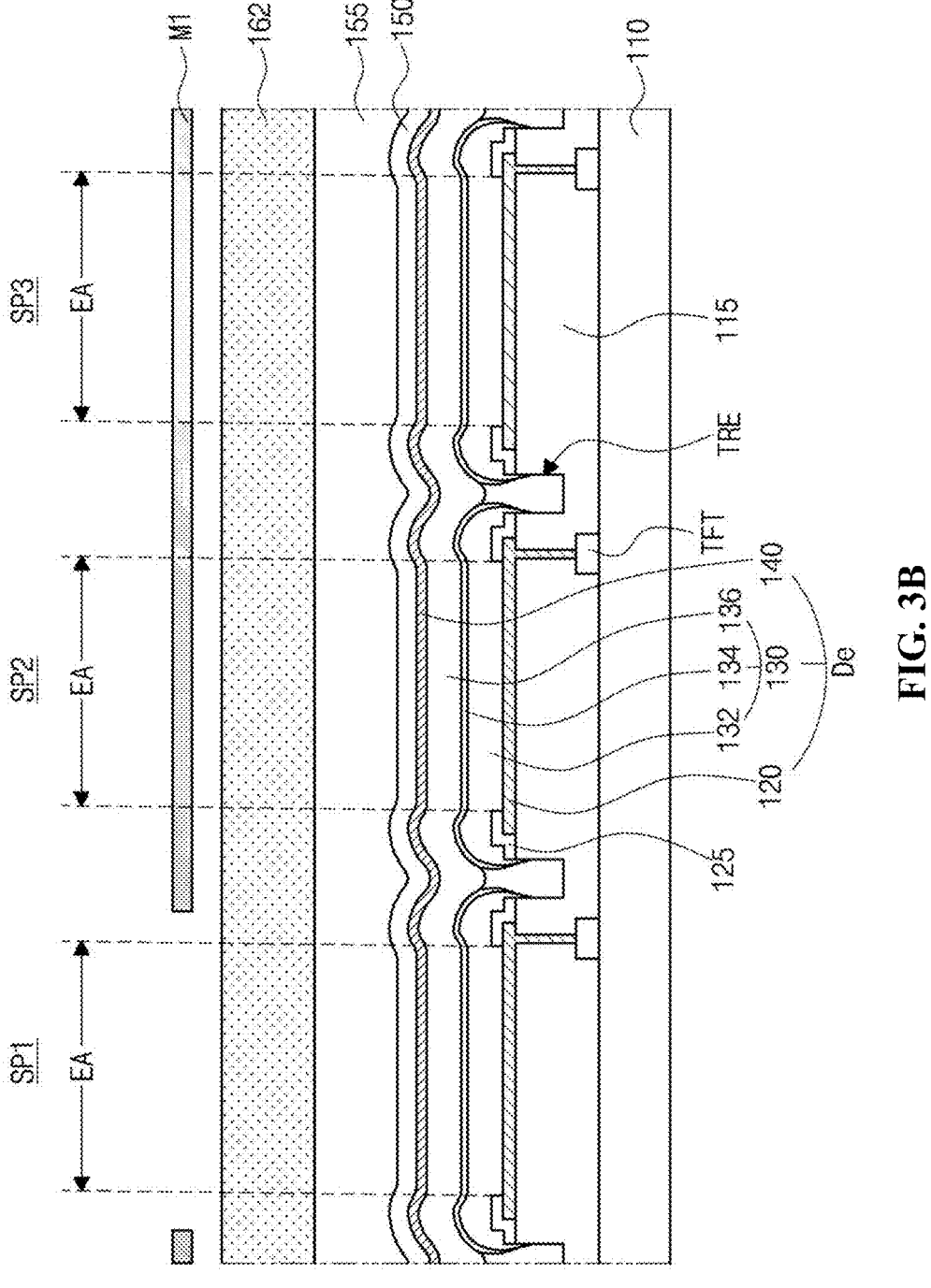

Next, in FIG. 3B, a color resist layer 162 can be formed on the encapsulation layer 155 by applying a color resist. For example, the color resist can be a red resist, and the color resist layer 162 can be a red resist layer.

Then, a first mask M1 can be disposed over the color resist layer 162, and the color resist layer 162 can be exposed to light through the first mask M1. Here, the color resist layer 162 can have negative photosensitivity in which a portion exposed to light remains after developing, and a light-transmitting portion of the first mask M1 can be disposed to correspond to the emission area EA of the first sub-pixel SP1. A width of the light-transmitting portion of the first mask M1 can be greater than the width of the emission area EA of the first sub-pixel SP1. UV can be used as a light source.

Figure 3C:
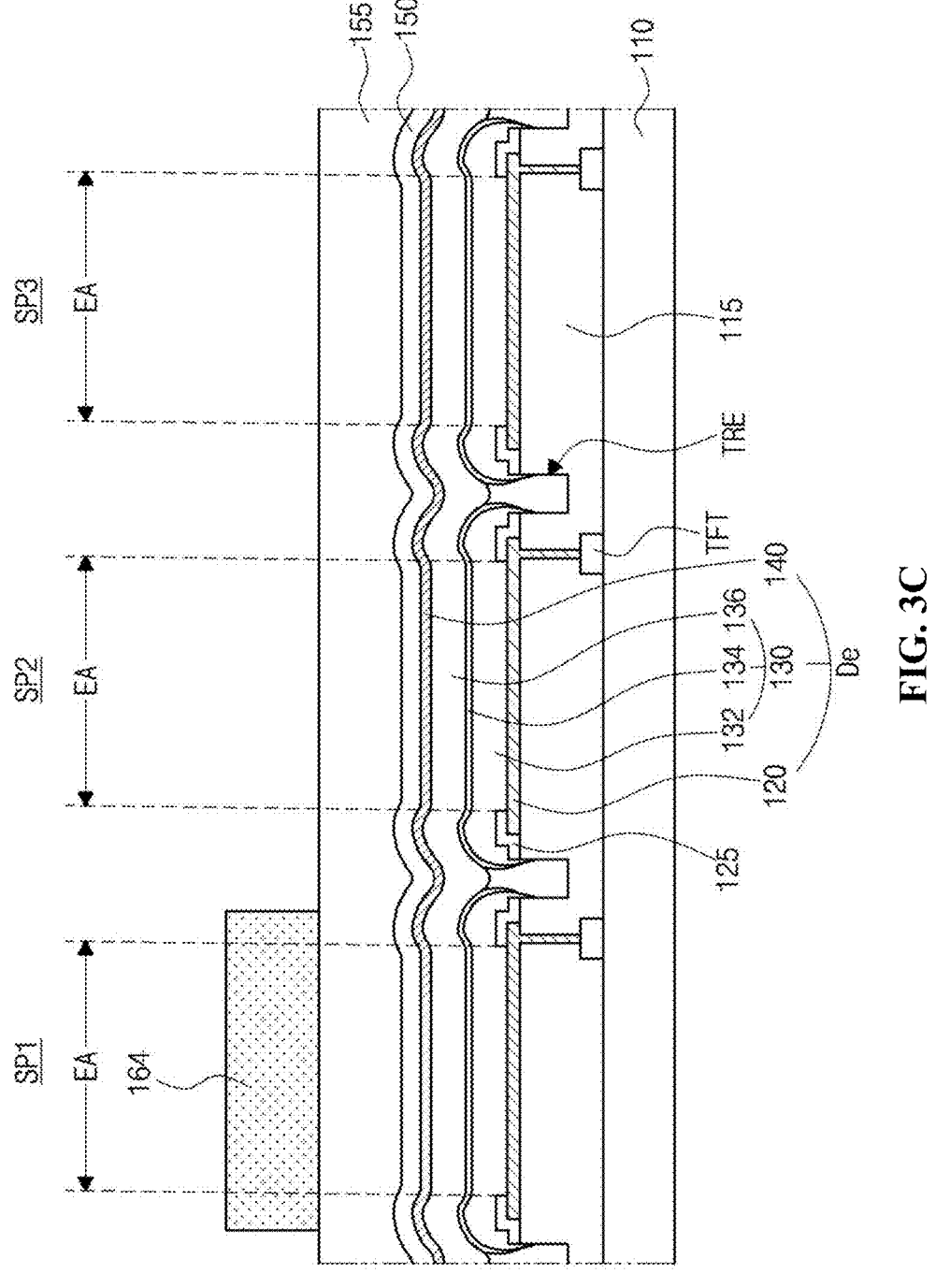

Next, in FIG. 3C, a color resist pattern 164 can be formed in the first sub-pixel SP1 by developing the color resist layer 162 exposed to light of FIG. 3B. Here, a width of the color resist patter 164 can be greater than the width of the emission area EA of the first sub-pixel SP1.

Figure 3D:
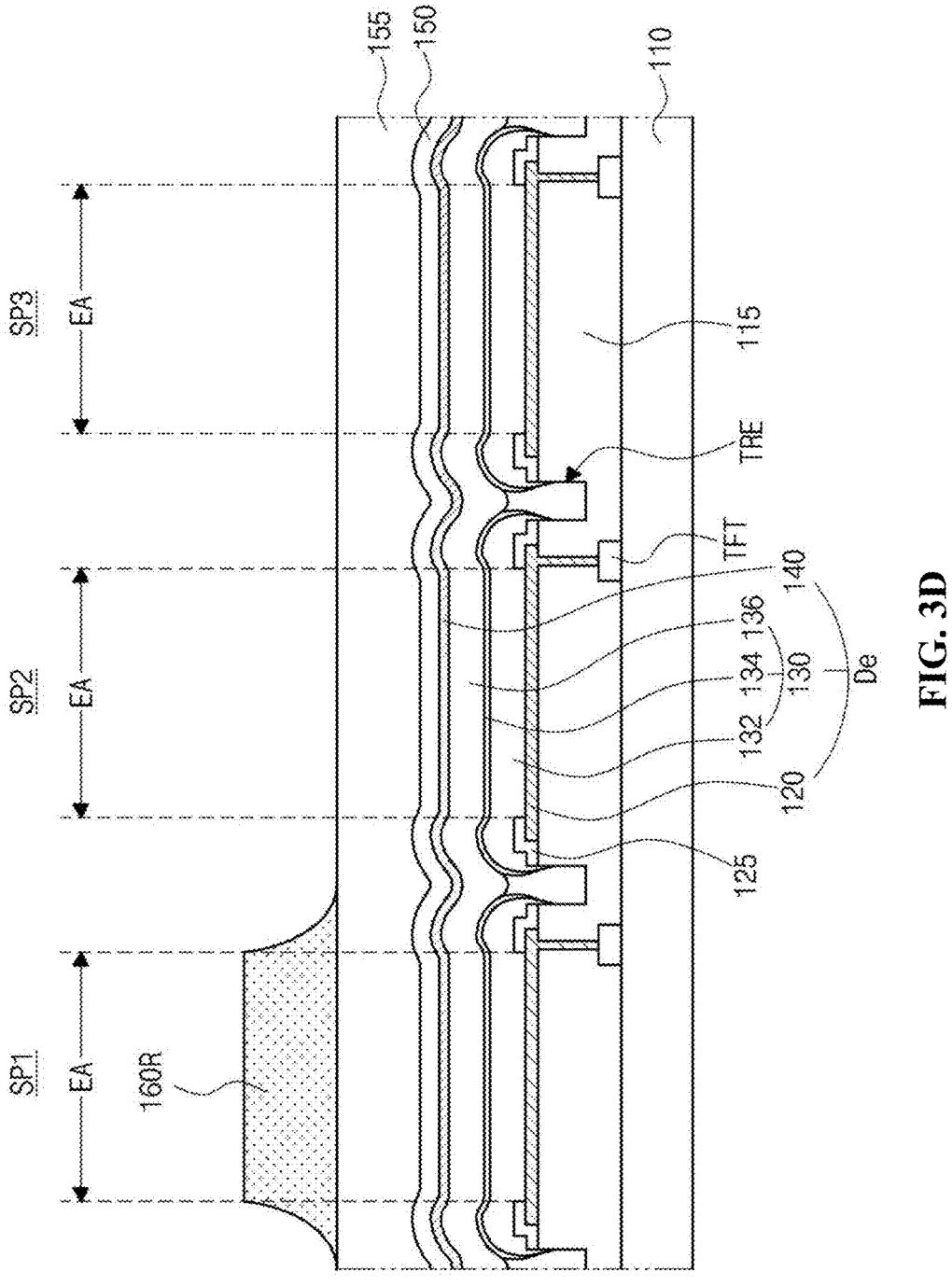

Next, in FIG. 3D, the first color filter 160R having the curved side surface can be formed by first curing the color resist pattern 164 of FIG. 3C at a first temperature for a first time. In this case, the color resist pattern 164 of FIG. 3C can include a thermal flow material having mobility by heat, and a curvature of the side surface of the first color filter 160R can be determined by adjusting the exposure focus during the exposure process of FIG. 3B.

Then, in order to reduce the sensitivity to heat in the subsequent processes, the entire surface exposure can be performed on the first color filter 160R. In this case, UV can be used as the light source, and the same UV as the UV used in the exposure process of FIG. 3B can be used.

Figure 3E:
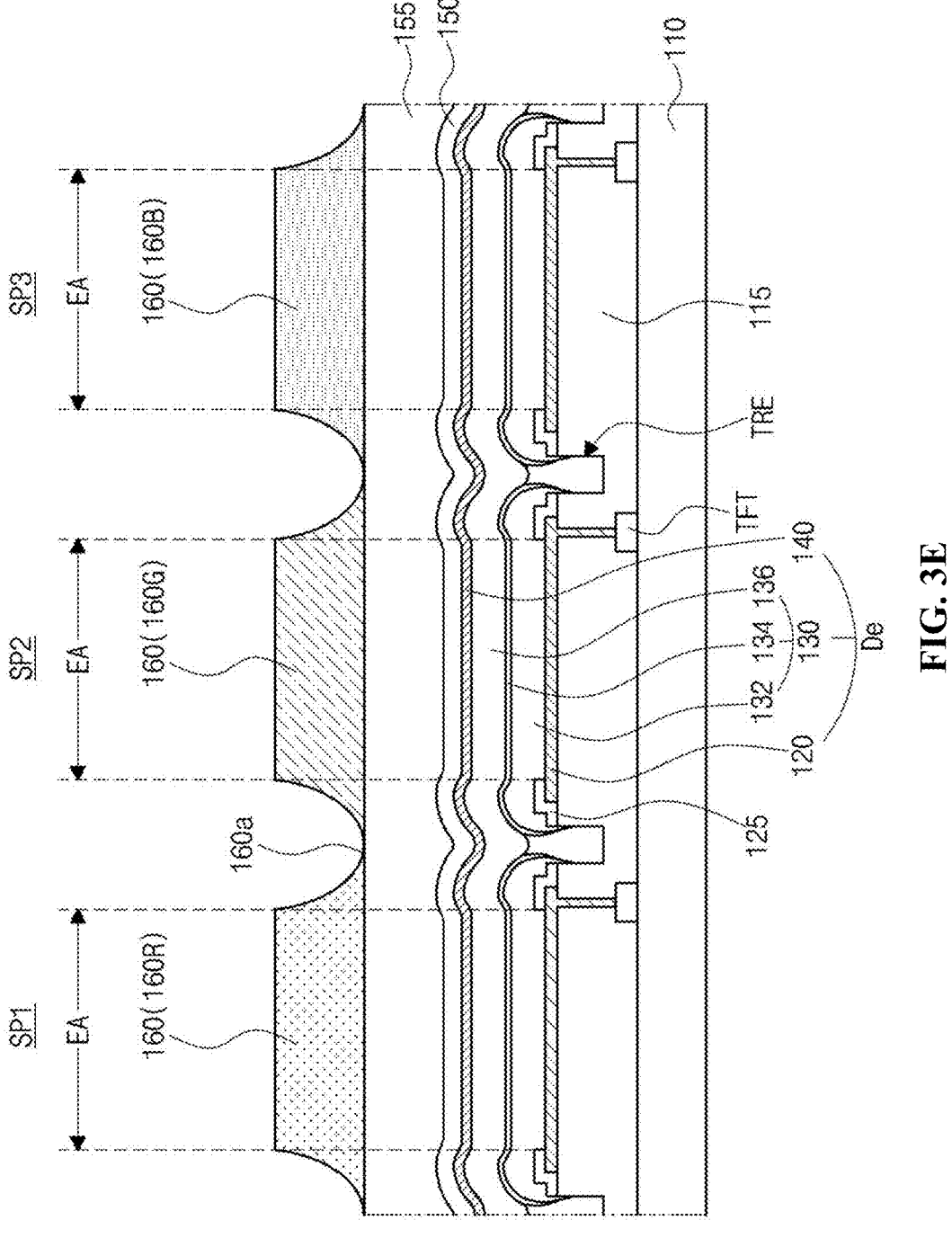

Next, in FIG. 3E, by performing the same processes as those in FIGS. 3B to 3D, the second color filter 160G can be formed in the second sub-pixel SP2, and the third color filter 160B can be formed in the third sub-pixel SP3, thereby completing the color filter 160.

Each of the first, second, and third color filters 160R, 160G, and 160B can have the curved side surface, and the concave portion 160a can be provided at the boundary between the adjacent sub-pixels SP1, SP2, and SP3 due to the side surfaces of the first, second, and third color filters 160R, 160G, and 160B.

Figure 3F:
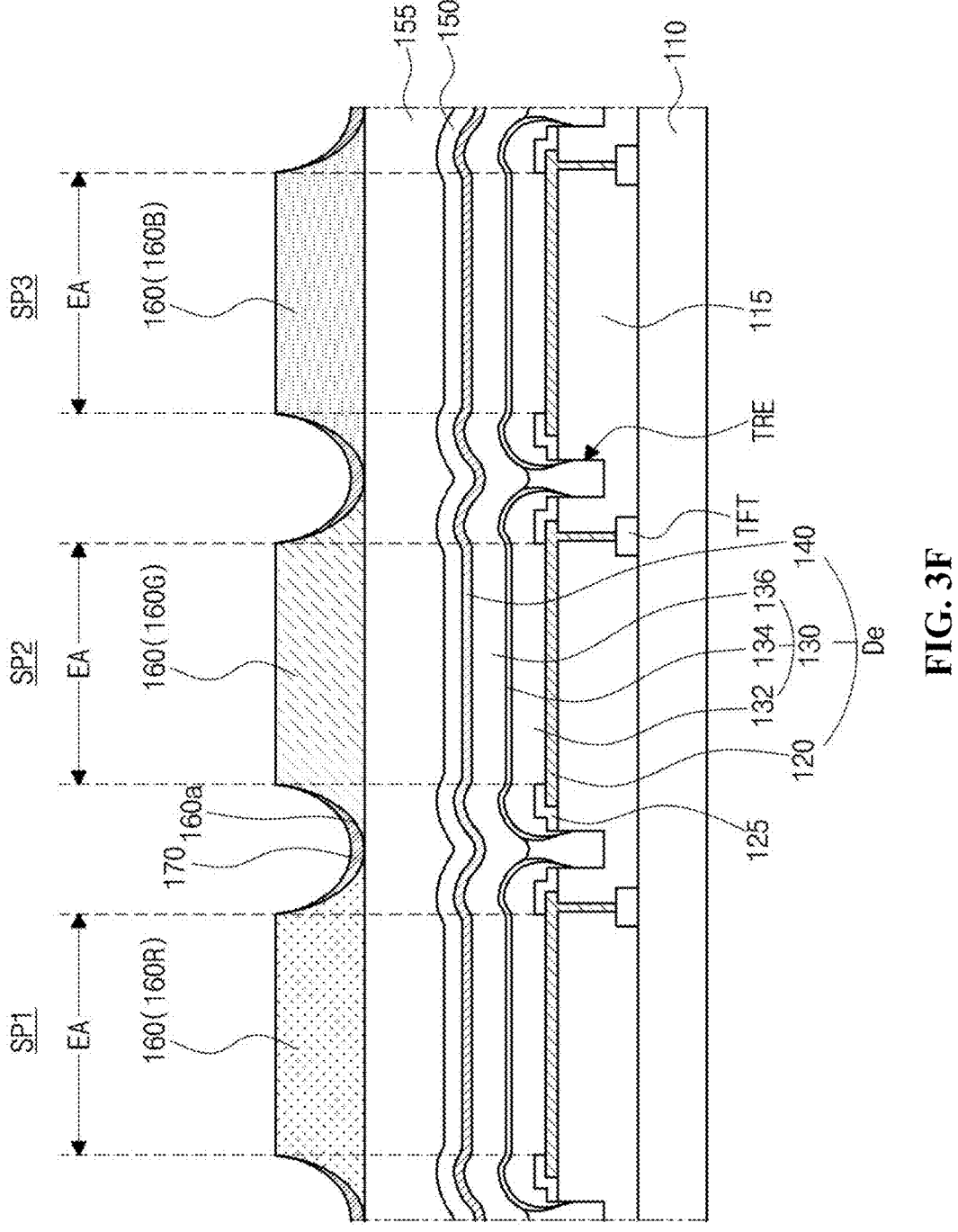

In FIG. 3F, the light absorption layer 170 can be formed on the concave portion 160a by depositing an inorganic material having a relatively high absorption coefficient. In this case, an open mask can be disposed over the first, second, and third color filters 160R, 160G, and 160B, and a metal material having a transmittance of 50% or less, for example, chromium (Cr), titanium (Ti), molybdenum (Mo), cobalt (Co), nickel (Ni), or an alloy thereof can be deposited on the concave portion 160a to thereby form the light absorption layer 170.

However, embodiments of the present disclosure are not limited thereto. Alternatively, a light absorption material layer can be formed over a substantially entire surface of the substrate 110 and be patterned through a photolithography process, thereby forming the light absorption layer 170 only on the concave portion 160a.

Figure 3G:
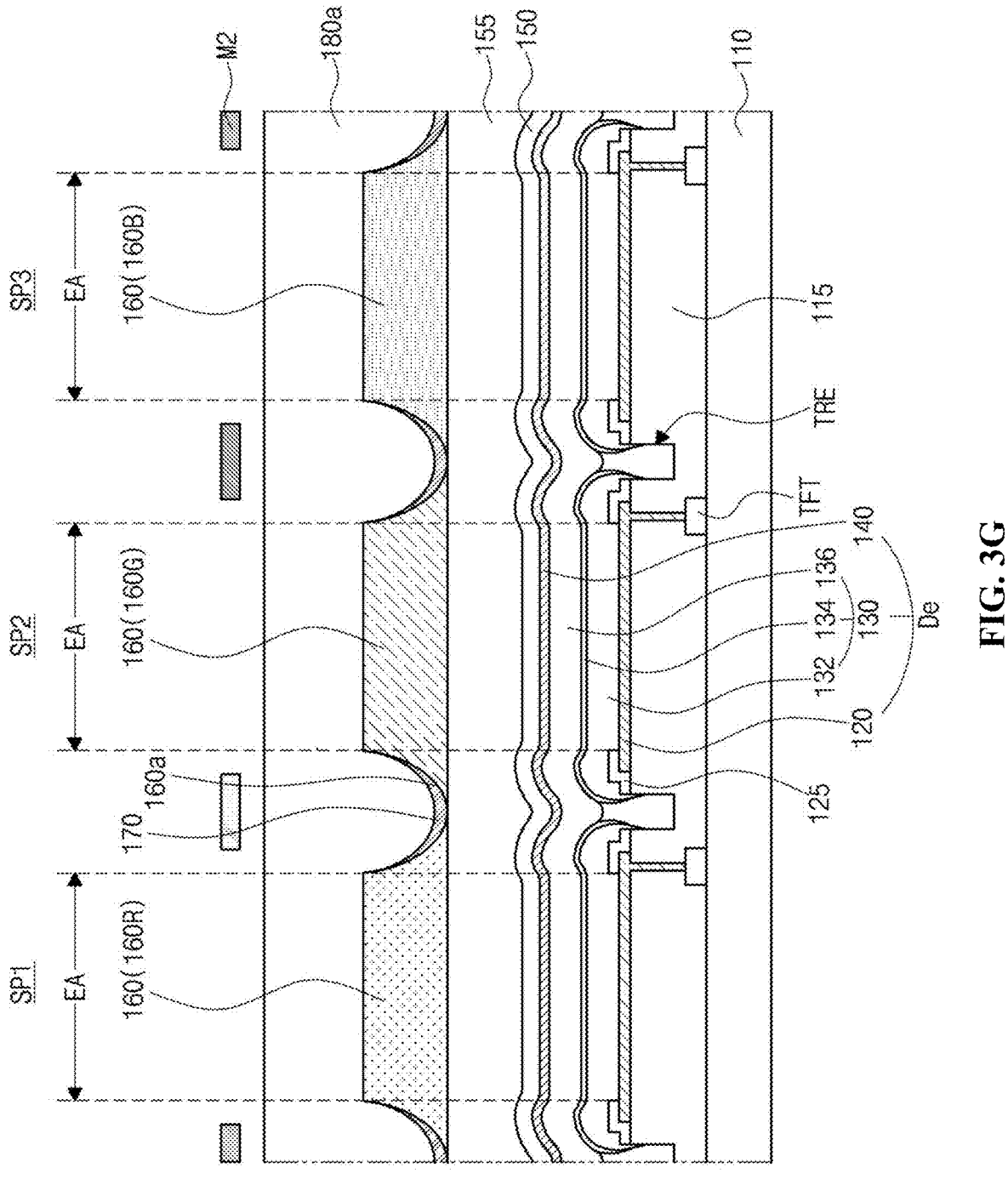

In FIG. 3G, a first organic layer 180a can be formed on the first, second, and third color filters 160R, 160G, and 160B and the light absorption layer 170 by applying an organic material having a relatively high refractive index.

Then, a second mask M2 can be disposed over the first organic layer 180a, and the first organic layer 180a can be exposed to light through the second mask M2. Here, the first organic layer 180a can have negative photosensitivity in which a portion exposed to light remains after developing, and a light-transmitting portion of the second mask M2 can be disposed to correspond to the emission area EA of each of the sub-pixels SP1, SP2, and SP3. A width of the light-transmitting portion of the second mask M2 can be greater than the width of the emission area EA of each of the sub-pixels SP1, SP2, and SP3. UV can be used as a light source, and the same UV as the UV used in the exposure process of FIG. 3B can be used.

Figure 3H:
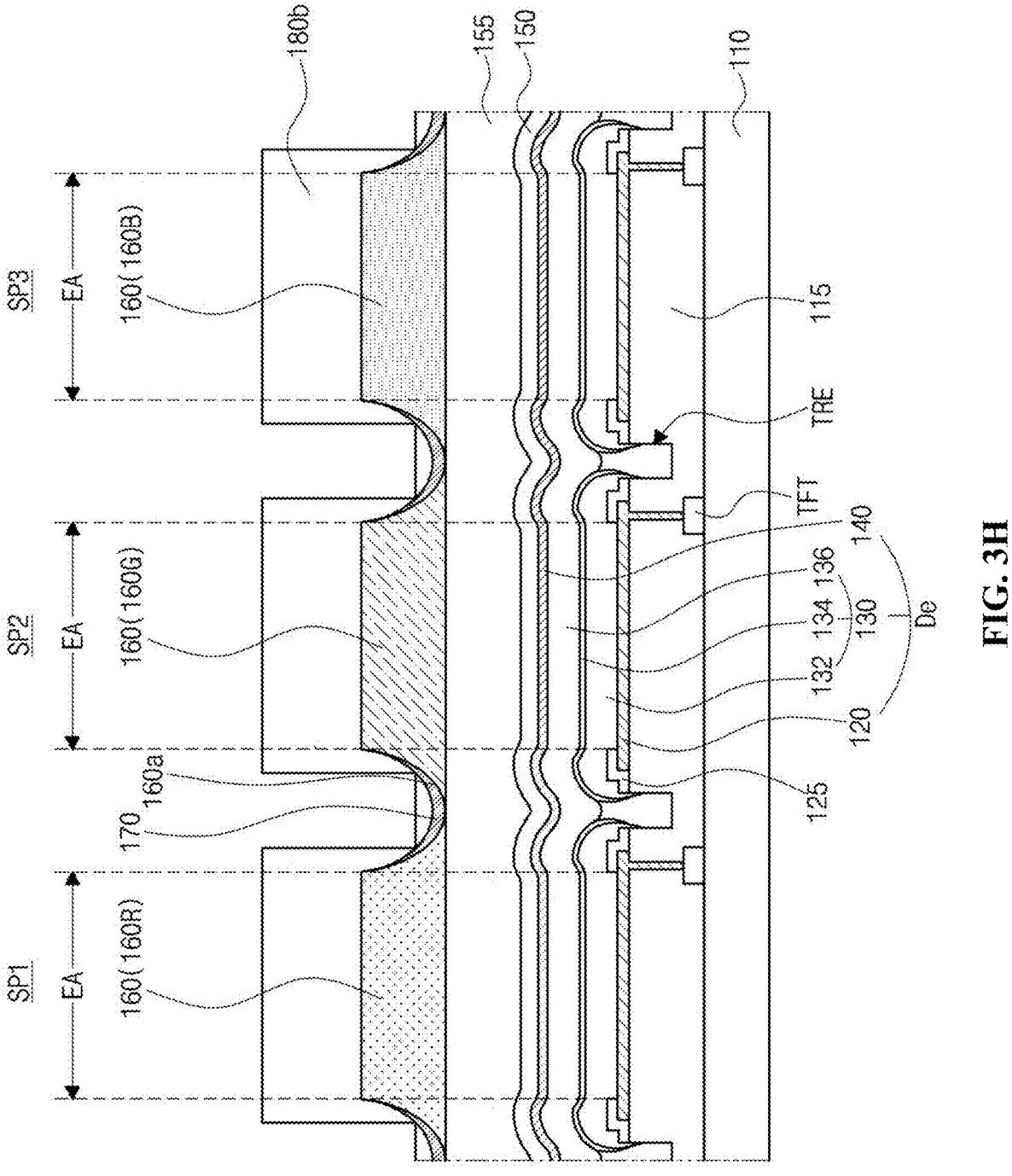

Next, in FIG. 3H, an organic pattern 180b can be formed to correspond to the emission area EA of each of the sub-pixels SP1, SP2, and SP3 by developing the first organic layer 180a exposed to light of FIG. 3G. Here, a width of the organic pattern 180b can be greater than the width of the emission area EA of each of the sub-pixels SP1, SP2, and SP3. Meanwhile, the first organic layer 180a of FIG. 3G may not be completely removed and can remain partially between the adjacent organic patterns 180b, that is on the light absorption layer 170.

Figure 3I:
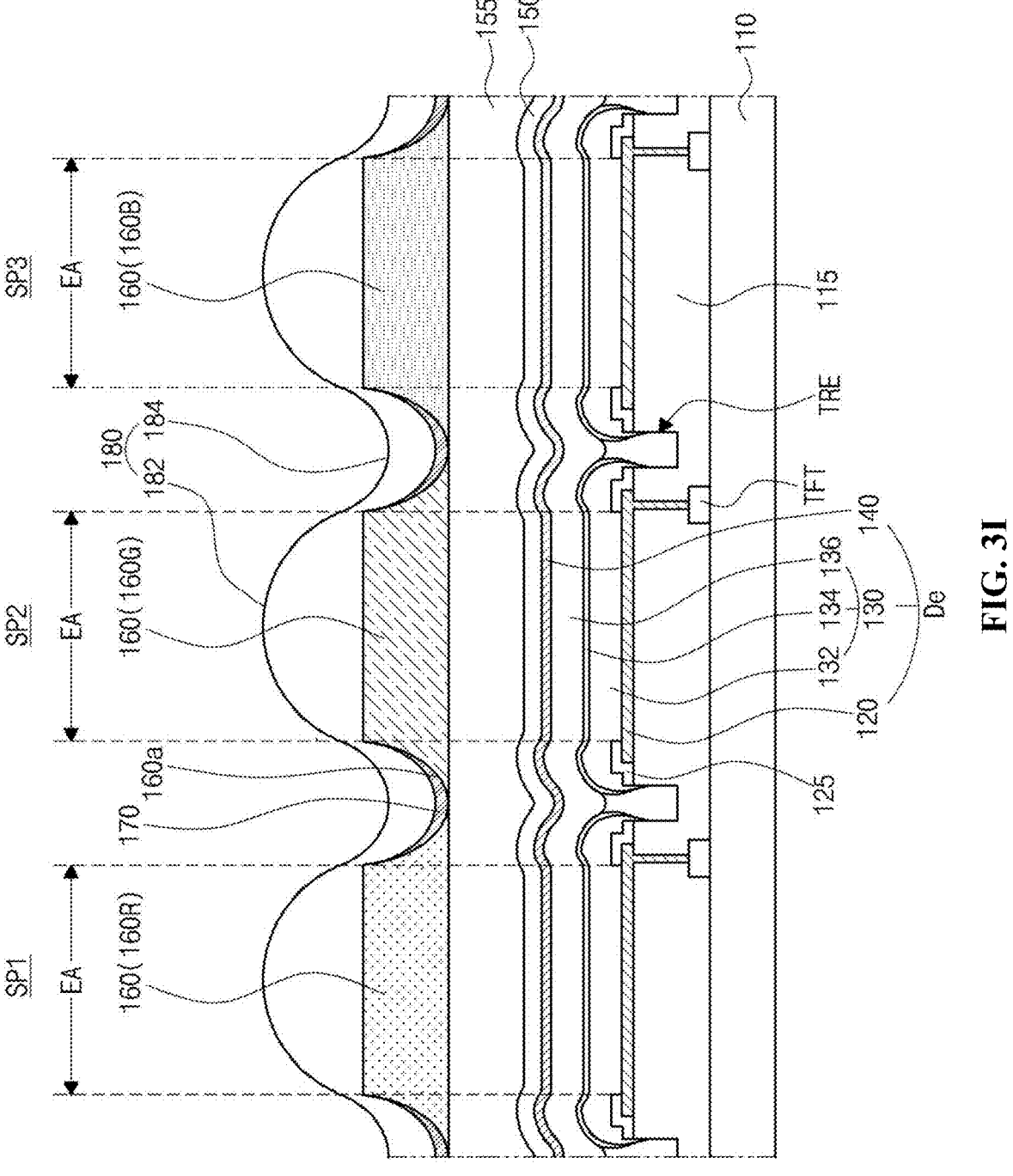

Next, in FIG. 3I, the lens layer 180 having the convex lens portion 182 and the concave lens portion 184 can be formed by second curing the organic pattern 180b of FIG. 3H at a second temperature for a second time. Here, the organic pattern 180b of FIG. 3H can include a thermal flow material having mobility by heat, and both side surfaces of the organic pattern 180b of FIG. 3H can flow down onto the concave portion 160a to thereby form a curvature. Here, the second temperature can be higher than the first temperature, and the second time can be longer than the first time.

The convex lens portion 182 can be disposed on each of the color filters 160R, 160G, and 160B, and the concave lens portion 184 can be disposed between the adjacent color filters 160R, 160G, and 160B, that is, on the concave portion 160a.

Figure 3J:
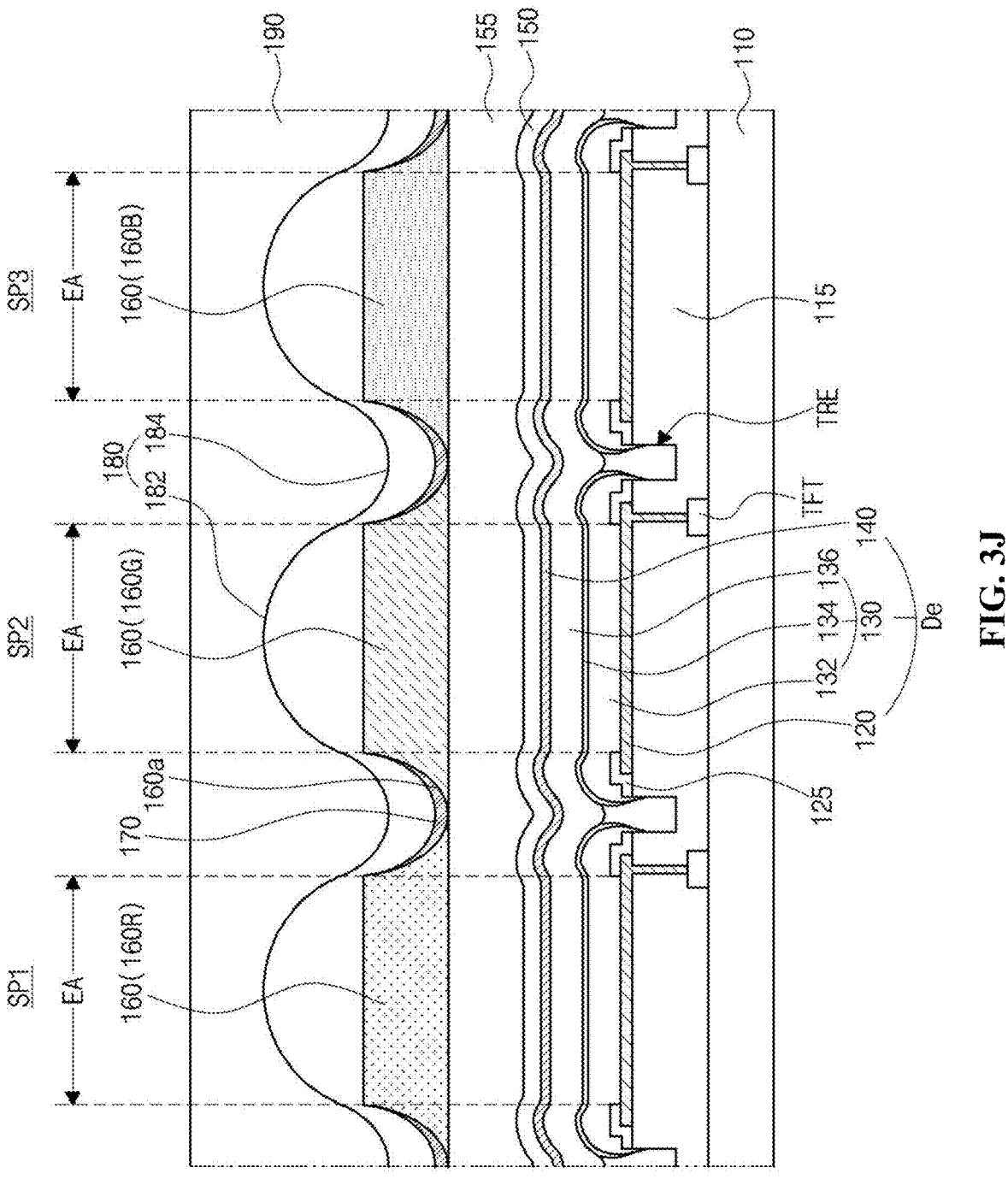

Next, in FIG. 3J, a second organic layer can be formed on the lens layer 180 by applying an organic material having a relatively low refractive index, and the overcoat layer 190 can be formed by entirely expose the second organic layer to light. The refractive index of the overcoat layer 190 can be lower than the refractive index of the lens layer 180. Here, UV can be used as the light source, and the same UV as the UV used in the exposure process of FIG. 3B can be used.

In the organic light-emitting diode display device according to the first embodiment of the present disclosure, reduction of the abnormal emission will be described with reference to FIGS. 4A to 4C.

Figure 4A:
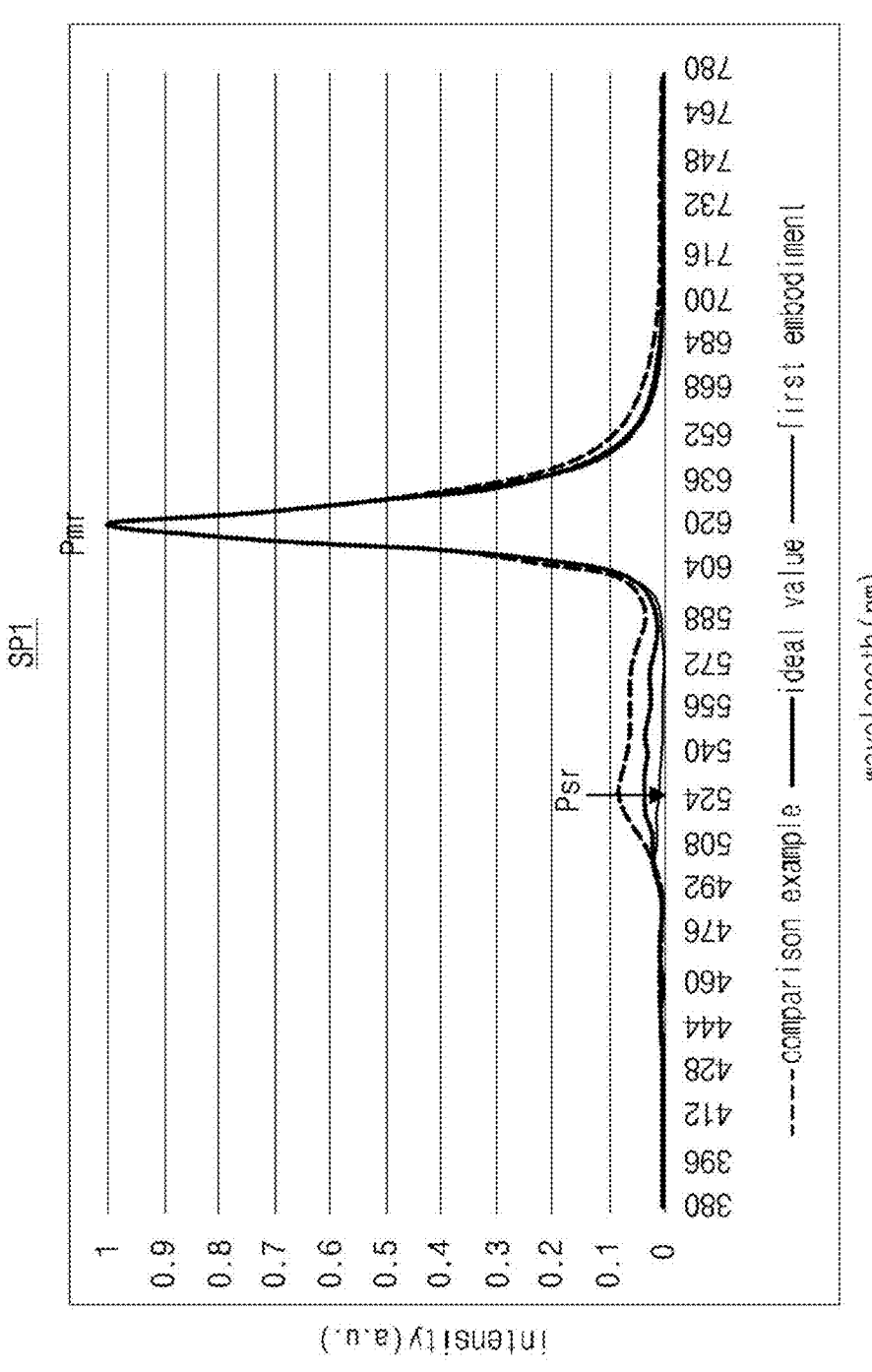
FIGS. 4A, 4B and 4C are views showing spectrums of lights respectively emitted from first, second, and third sub-pixels of an organic light-emitting diode display device according to a first embodiment of the present disclosure.
Figure 4B:
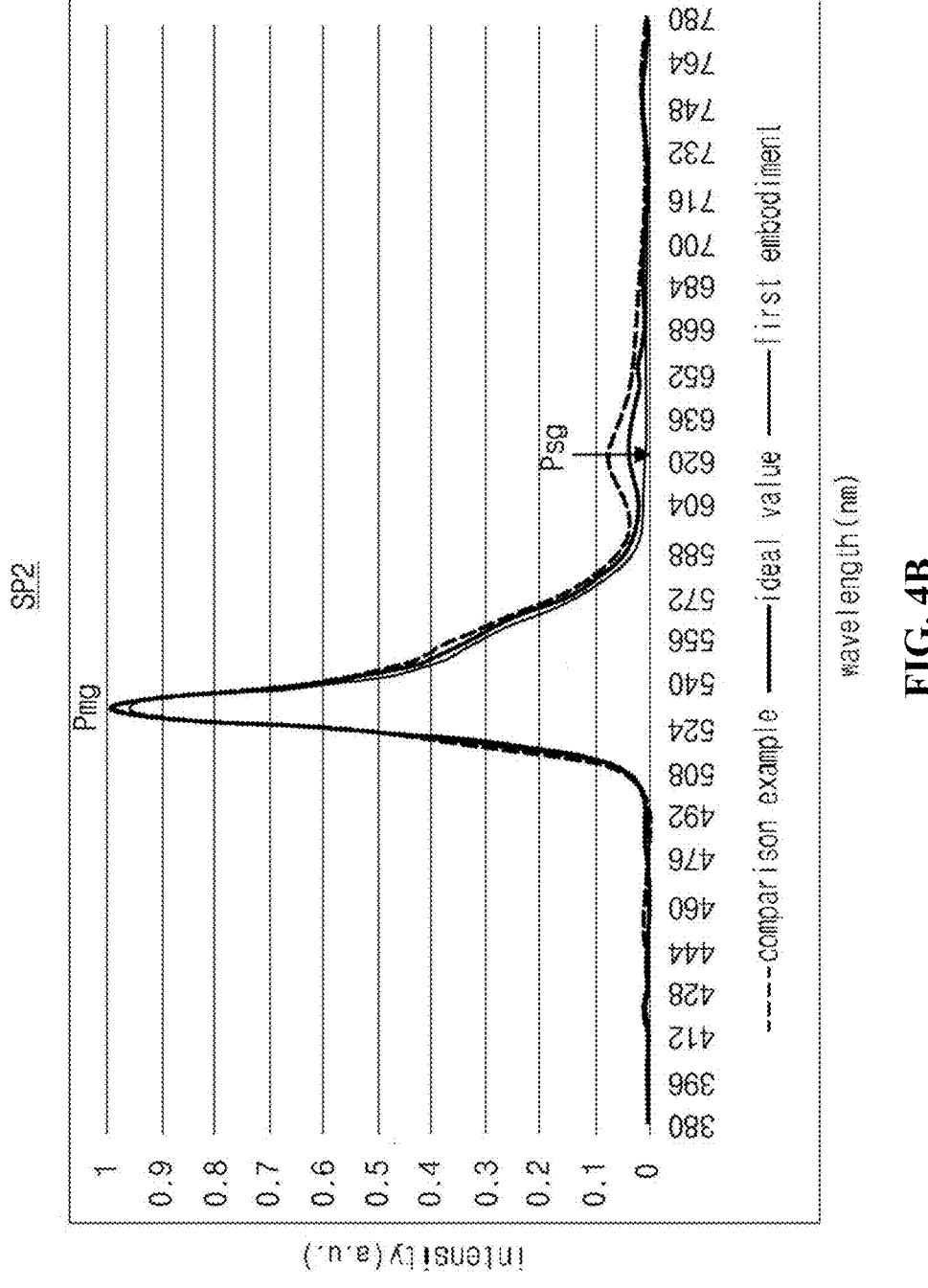
Figure 4C:
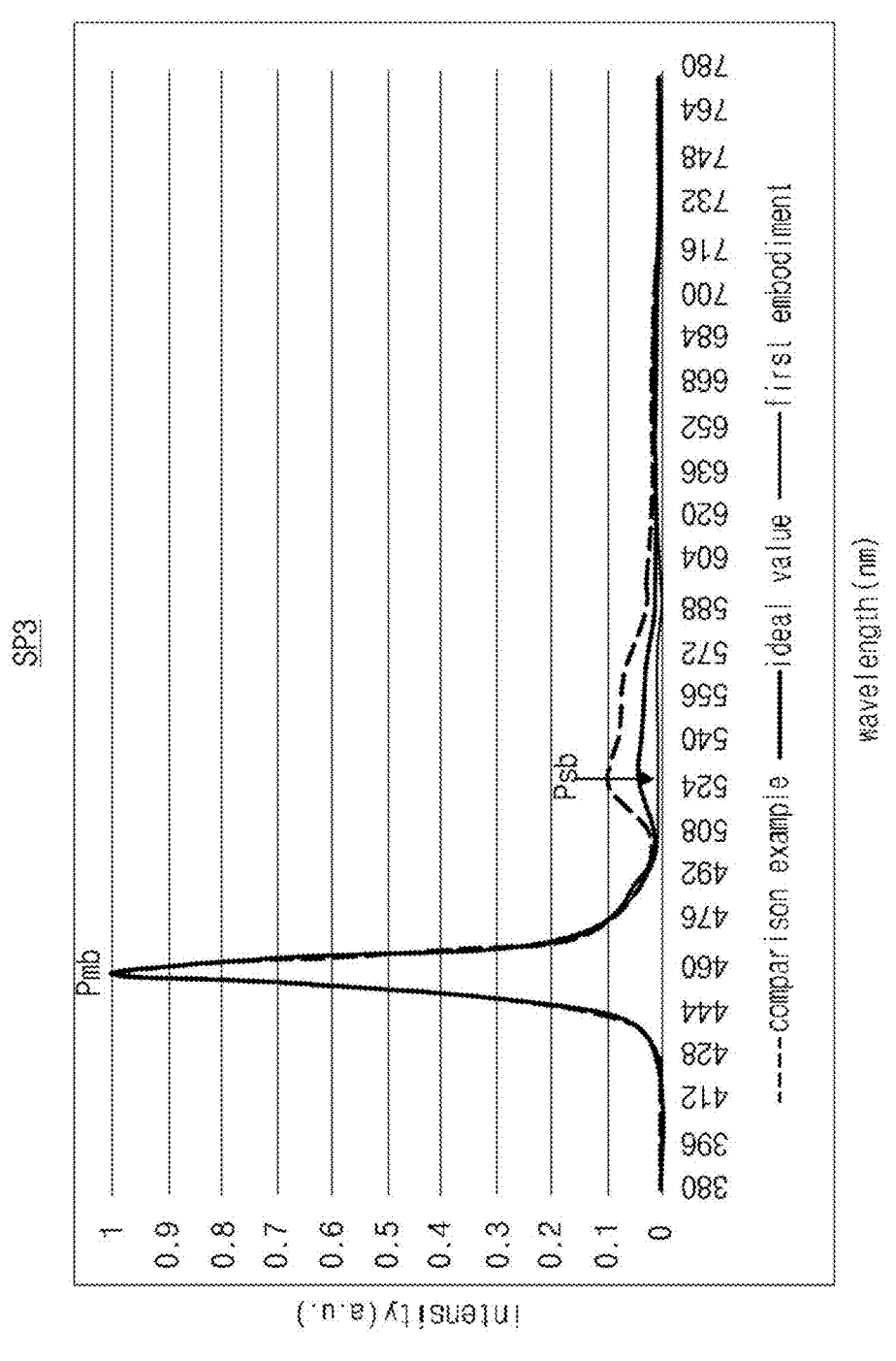

FIGS. 4A, 4B and 4C are views showing spectrums of lights respectively emitted from the first, second, and third sub-pixels of an organic light-emitting diode display device according to the first embodiment of the present disclosure and show a comparison example and an ideal value together. FIGS. 4A, 4B and 4C will be described with reference to FIGS. 1 and 2 together.

Here, the first, second, and third sub-pixels SP1, SP2, and SP3 can be red, green, and blue sub-pixels including red, green, and blue color filters, respectively, and an organic light-emitting diode display device according to the comparison example does not include an abnormal emission reduction configuration such as a black matrix or a light absorption layer between the adjacent sub-pixels SP1, SP2, and SP3.

In FIG. 4A, an ideal red colored light has a red main peak Pmr corresponding to a red color and does not have a red sub peak Psr spaced apart from the red main peak Pmr.

On the other hand, each of the light emitted from a red sub-pixel of the organic light-emitting diode display device of the comparison example and the light emitted from the red sub-pixel SP1 of the organic light-emitting diode display device 1000 according to the first embodiment of the present disclosure has a red main peak Pmr emitted from the emission area and corresponding to a red color and a red sub peak Psr spaced apart from the red main peak Pmr. When the red main peak Pmr has an intensity of about 1, the red sub peak Psr of the comparison example has an intensity of about 0.08, and the red sub peak Psr of the first embodiment of the present disclosure has an intensity of about 0.04.

That is, in the first embodiment of the present disclosure, since the light emitted from the non-emission area of the red sub-pixel SP1 is absorbed and blocked by the light absorption layer 170 and refracted by the concave lens portion 184 of the lens layer 180, the intensity of the red sub peak Psr is reduced and the abnormal emission due to the non-emission area is reduced and minimized as compared with the comparison example.

Next, in FIG. 4B, an ideal green colored light has a green main peak Pmg corresponding to a green color and does not have a green sub peak Psg spaced apart from the green main peak Pmg.

On the other hand, each of the light emitted from a green sub-pixel of the organic light-emitting diode display device of the comparison example and the light emitted from the green sub-pixel SP2 of the organic light-emitting diode display device 1000 according to the first embodiment of the present disclosure has a green main peak Pmg emitted from the emission area and corresponding to a green color and a green sub peak Psg spaced apart from the green main peak Pmg. When the green main peak Pmg has an intensity of about 1, the green sub peak Psg of the comparison example has an intensity of about 0.075 and the green sub peak Psg of the first embodiment of the present disclosure has an intensity of about 0.04.

That is, in the first embodiment of the present disclosure, since the light emitted from the non-emission area of the green sub-pixel SP2 is absorbed and blocked by the light absorption layer 170 and refracted by the concave lens portion 184 of the lens layer 180, the intensity of the green sub peak Psg is reduced and the abnormal emission due to the non-emission area is reduced and minimized as compared with the comparison example.

Next, in FIG. 4C, an ideal blue colored light has a blue main peak Pmb corresponding to a blue color and does not have a blue sub peak Psb spaced apart from the blue main peak Pmb.

On the other hand, each of the light emitted from a blue sub-pixel of the organic light-emitting diode display device of the comparison example and the light emitted from the blue sub-pixel SP3 of the organic light-emitting diode display device 1000 according to the first embodiment of the present disclosure has a blue main peak Pmb emitted from the emission area and corresponding to a blue color and a blue sub peak Psb spaced apart from the blue main peak Pmb. When the blue main peak Pmb has an intensity of about 1, the blue sub peak Psb of the comparison example has an intensity of about 0.1 and the blue sub peak Psb of the first embodiment of the present disclosure has an intensity of about 0.04.

That is, in the first embodiment of the present disclosure, since the light emitted from the non-emission area of the blue sub-pixel SP3 is absorbed and blocked by the light absorption layer 170 and refracted by the concave lens portion 184 of the lens layer 180, the intensity of the blue sub peak Psb is reduced and the abnormal emission due to the non-emission area is reduced and minimized as compared with the comparison example.

In the first embodiment of the present disclosure, the location of the light absorption layer can be changed. A modified example of the first embodiment of the present disclosure will be described with reference to FIG. 5.

Figure 5:
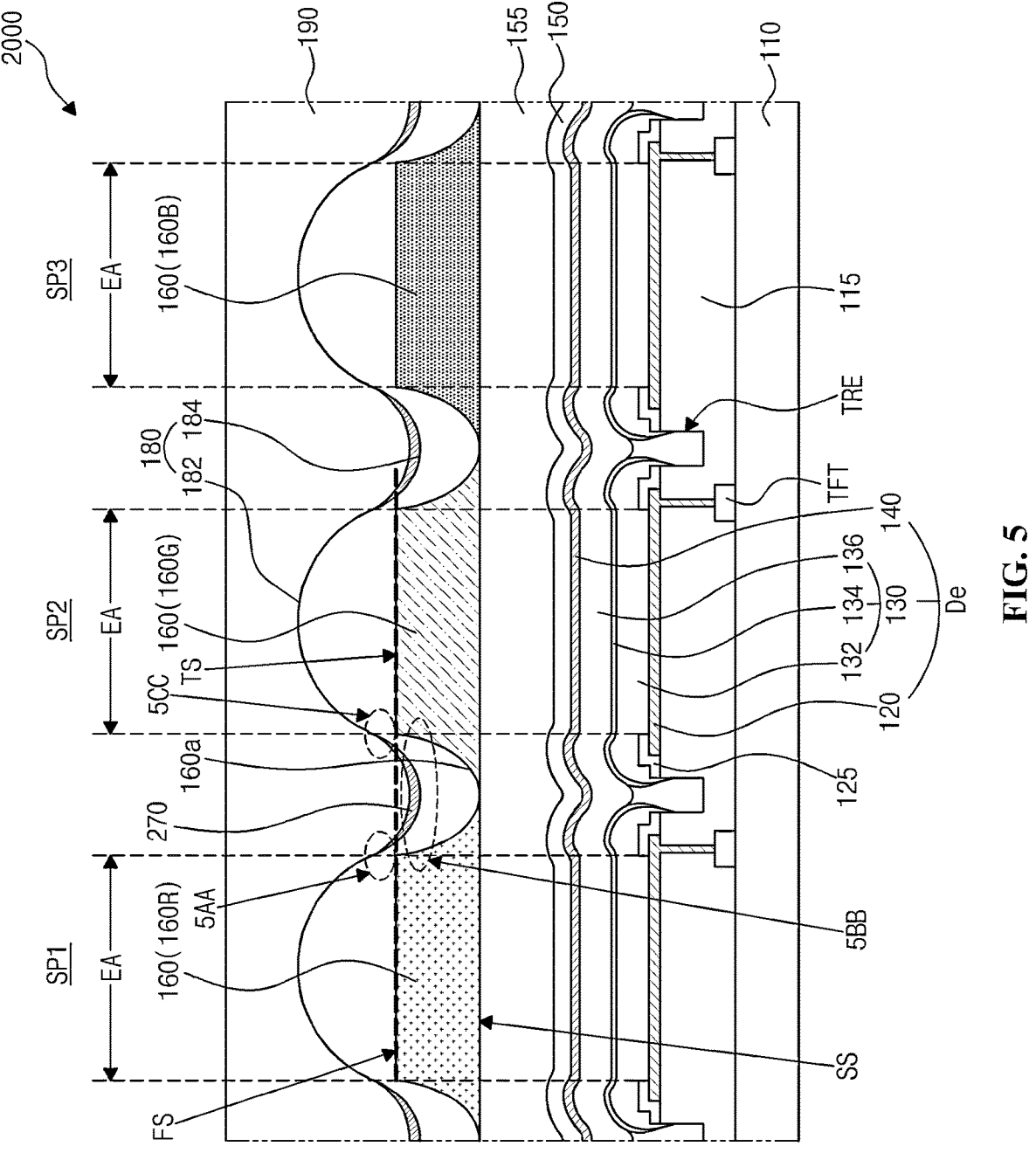
FIG. 5 is a schematic cross-sectional view of an organic light-emitting diode display device according to a modified example of a first embodiment of the present disclosure.

FIG. 5 is a schematic cross-sectional view of an organic light-emitting diode display device according to a modified example of the first embodiment of the present disclosure. An organic light-emitting diode display device 2000 according to a modified example of the first embodiment of the present disclosure can have substantially the same configurations as those of the first embodiment of FIG. 2 except for the location of the light absorption layer. The same parts as those of the first embodiment are designated by the same reference signs, and explanation for the same parts will be shortened or omitted.

As shown in FIG. 5, in the organic light-emitting diode display device 2000 according to the modified example of the first embodiment of the present disclosure, a thin film transistor TFT and a light-emitting diode De can be disposed in each of first, second, and third sub-pixels SP1, SP2, and SP3 on a substrate 110, and a trench TRE can be provided between the adjacent sub-pixels SP1, SP2, and SP3.

A passivation layer 150 and an encapsulation layer 155 can be sequentially disposed on the light-emitting diode De, and a color filter 160 can be disposed over the encapsulation layer 155. The color filter 160 can include first, second, and third color filters 160R, 160G, and 160B corresponding to the first, second, and third sub-pixels SP1, SP2, and SP3, respectively. A side surface of each of the first, second, and third color filters 160R, 160G, and 160B can be curved, and a concave portion 160a can be provided between the adjacent color filters 160R, 160G, and 160B due to the curved side surfaces.

A lens layer 180 can be disposed on the first, second, and third color filters 160R, 160G, and 160B. The lens layer 180 can have a convex lens portion 182 on each of the color filters 160R, 160G, and 160B of the emission area EA and a concave lens portion 184 on the concave portion 160a of the non-emission area. The lens layer 180 can be in contact with the upper and side surfaces of each of the color filters 160R, 160G, and 160B.

A light absorption layer 270 can be provided on the concave lens portion 184 of the lens layer 180. The light absorption layer 270 can correspond to the non-emission area and be disposed over the concave portion 160a. The light absorption layer 270 can be formed along the shape of the concave lens portion 184, and an upper surface of the light absorption layer 270 can have a concave shape toward the substrate 110.

The light absorption layer 270 can be formed of an inorganic material having a relatively high absorption rate and a relatively low transmittance. The light absorption layer 270 can be formed of a metal material having a transmittance of 50% or less. For example, the light absorption layer 270 can be formed of chromium (Cr), titanium (Ti), molybdenum (Mo), cobalt (Co), nickel (Ni), or an alloy thereof. However, embodiments of the present disclosure are not limited thereto.

An overcoat layer 190 can be disposed on the lens layer 180 and the light absorption layer 270. The overcoat layer 190 can eliminate a step difference caused by the layers thereunder and can have a substantially flat upper surface. The overcoat layer 190 can have a lower refractive index than the lens layer 180. The difference between the refractive indexes of the lens layer 180 and the overcoat layer 190 can be about 2 or more.

The organic light-emitting diode display device 2000 according to the modified example of the first embodiment of the present disclosure can be manufactured by substantially the same method as the manufacturing method mentioned in FIGS. 3A to 3J, except that the step of forming the light absorption layer 170 of FIG. 3F is performed between the steps of FIG. 3I and FIG. 3J.

As described above, in the modified example of the first embodiment of the present disclosure, the light absorption layer 270 can be provided between the lens layer 180 and the overcoat layer 190.

However, embodiments of the present disclosure are not limited thereto. Alternatively, the light absorption layer 270 can be omitted.

Referring to FIG. 5, the first color filter 160R includes a first surface FS and a second surface SS opposite the first surface FS. The second color filter 160G includes a third surface TS and the second surface SS. Here, the third surface TS is adjacent to the first surface FS and is spaced apart from the first surface FS. Similar to what was shown in FIG. 2, the first groove G1 is between the first surface FS of the first color filter 160R and the third surface TS of the second color filter 160G. In some embodiments, the first ridge R1 of the lens layer 180 is disposed above the first surface FS of the color filter 160. In some embodiments, the first valley V1 of the lens layer 180 extends towards the first groove G1 so as to be disposed below the first surface FS of the color filter 160. That is, a portion 5BB indicates that some portion of the first valley V1 is disposed below the first surface FS of the first color filter 160R or the third surface TS of the second color filter 160G. On the other hand, portions 5AA, 5CC indicate that some portions of the first valley V1 is disposed above the first surface FS of the first color filter 160R or the third surface TS of the second color filter 160G.

In addition, the light absorption layer 270 is disposed on the first groove G1 and is between the first surface FS of the first color filter 160R and the third surface TS of the second color filter 160G. In some embodiments, the light absorption layer 170 is disposed on the first valley V1. Here, the light absorption layer 270 includes a portion that extends below the first surface FS of the first color filter 160R (see portion 5BB) and another portion that extends above the first surface FS of the first color filter 160R (see portions 5AA, 5CC).

In the above embodiments, the convex lens portion and the concave lens portion of the lens layer can be formed through the same process. However, in other embodiments of the present disclosure, the convex lens portion and the concave lens portion of the lens layer can be formed through different processes. Such a second embodiment of the present disclosure will be described with reference to FIG. 6.

Figure 6:
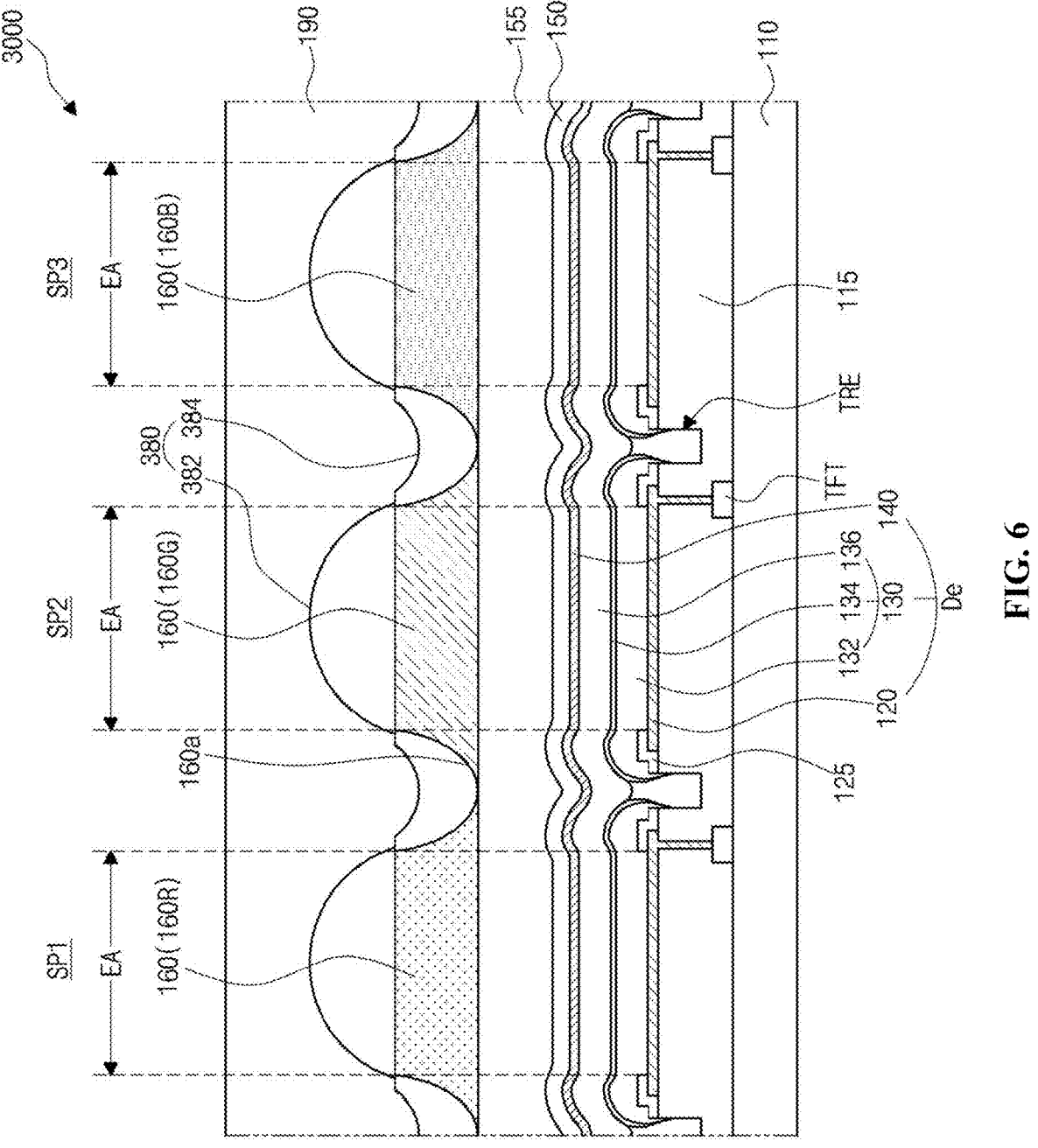
FIG. 6 is a schematic cross-sectional view of an organic light-emitting diode display device according to a second embodiment of the present disclosure.

FIG. 6 is a schematic cross-sectional view of an organic light-emitting diode display device according to a second embodiment of the present disclosure. An organic light-emitting diode display device 3000 according to a second embodiment of the present disclosure can have substantially the same configurations as those of the above embodiments except for the light absorption layer and the lens layer. The same parts as those of the above embodiments are designated by the same reference signs, and explanation for the same parts will be shortened or omitted.

As shown in FIG. 6, in the organic light-emitting diode display device 3000 according to the second embodiment of the present disclosure, a thin film transistor TFT and a light-emitting diode De can be disposed in each of first, second, and third sub-pixels SP1, SP2, and SP3 on a substrate 110, and a trench TRE can be provided between the adjacent sub-pixels SP1, SP2, and SP3.

A passivation layer 150 and an encapsulation layer 155 can be sequentially disposed on the light-emitting diode De, and a color filter 160 can be disposed over the encapsulation layer 155. The color filter 160 can include first, second, and third color filters 160R, 160G, and 160B corresponding to the first, second, and third sub-pixels SP1, SP2, and SP3, respectively. A side surface of each of the first, second, and third color filters 160R, 160G, and 160B can be curved, and a concave portion 160a can be provided between the adjacent color filters 160R, 160G, and 160B due to the curved side surfaces.

A lens layer 380 can be disposed on the first, second, and third color filters 160R, 160G, and 160B. The lens layer 380 can include a convex lens portion 382 on each of the color filters 160R, 160G, and 160B of the emission area EA and a concave lens portion 384 on the concave portion 160a of the non-emission area. The lens layer 380 can be in contact with the upper and side surfaces of the first, second, and third color filters 160R, 160G, and 160B.

The concave lens portion 384 of the lens layer 380 can have an upper surface which is partially flat. Here, the upper surface of the concave lens portion 384 adjacent to each of the color filters 160R, 160G, and 160B can be flat, and the flat upper surface of the concave lens portion 384 can be substantially flush with the upper surface of each of the color filters 160R, 160G, and 160B.

In addition, an edge of a lower end of the convex lens portion 382 can be disposed on the flat upper surface of the concave lens portion 384.

The concave lens portion 384 and the convex lens portion 382 can be formed through different processes. Specifically, after forming the concave lens portion 384 between the adjacent color filters 160R, 160G, and 160B, the convex lens portion 382 can be formed on each of the color filters 160R, 160G, and 160B.

An overcoat layer 190 can be disposed on the lens layer 380. The overcoat layer 190 can eliminate a step difference caused by the layers thereunder and can have a substantially flat upper surface. The overcoat layer 190 can have a lower refractive index than the lens layer 380. The difference between the refractive indexes of the lens layer 380 and the overcoat layer 190 can be about 2 or more.

It has been described that the organic light-emitting diode display device 3000 according to the second embodiment of the present disclosure does not include a light absorption layer, but a light absorption layer can be further provided between the color filter 160 and the lens layer 380 or between the lens layer 380 and the overcoat layer 190 corresponding to the non-emission area.

The organic light-emitting diode display device 3000 according to the second embodiment of the present disclosure can be manufactured by substantially the same method as the manufacturing method mentioned in FIGS. 3A to 3J except for the step of forming the lens layer 380.

As described above, in the second embodiment of the present disclosure, by forming the convex lens portion 382 after forming the concave lens portion 384 having the upper surface which is partially flat, it is easy to control the shape of the convex lens portion 382 of the lens layer 380, and a lens having a desired shape can be implemented.

Figure 7:
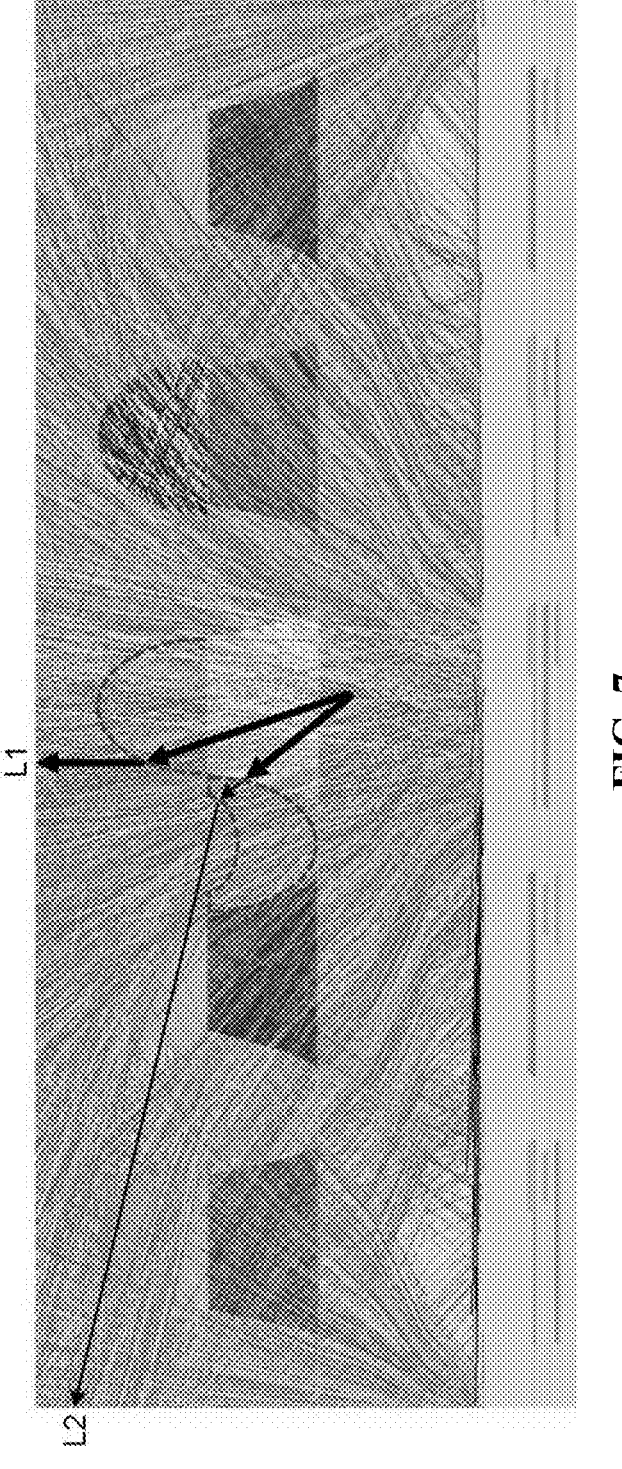
FIG. 7 is a view showing a simulation result of a light path of an organic light-emitting diode display device according to an embodiment of the present disclosure.

FIG. 7 is a view showing a simulation result of a light path of an organic light-emitting diode display device according to an embodiment of the present disclosure and is described with reference to FIG. 2 together.

In FIG. 7, the first light L1 output from the light-emitting diode De to the emission area EA passes through the color filter 160 and then is refracted and output in the front direction of the display device by the convex lens portion 182 of the lens layer 180. Accordingly, the light efficiency can be increased.

On the other hand, the second light L2 output from the light-emitting diode De to the non-emission area passes through the color filter 160 and then is refracted toward the side of the display device by the concave lens portion 184 of the lens layer 180 to be totally reflected or output out of the viewing angle. Accordingly, abnormal emission in the non-emission area can be reduced.

Meanwhile, when the light absorption layer 170 is provided in the non-emission area, a part of the second light L2 is absorbed by the light absorption layer 170, and only the rest is refracted by the concave lens portion 184, so that abnormal emission of the non-emission area can be reducing or minimized.

Figure 8A:
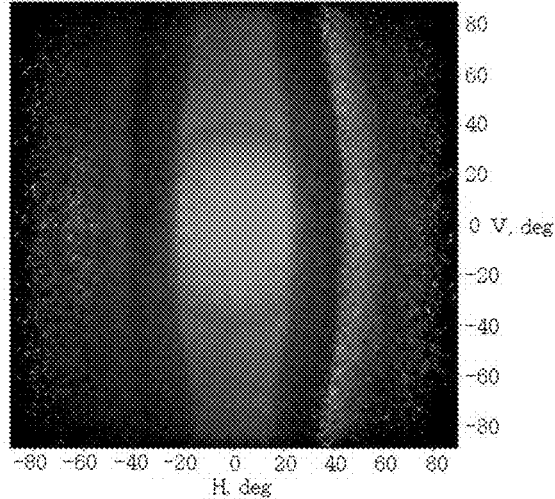
FIGS. 8A to 8D are views showing simulation results of emission characteristics with respect to viewing angles of organic light-emitting diode display devices according to embodiments of the present disclosure and comparison examples.
Figure 8B:
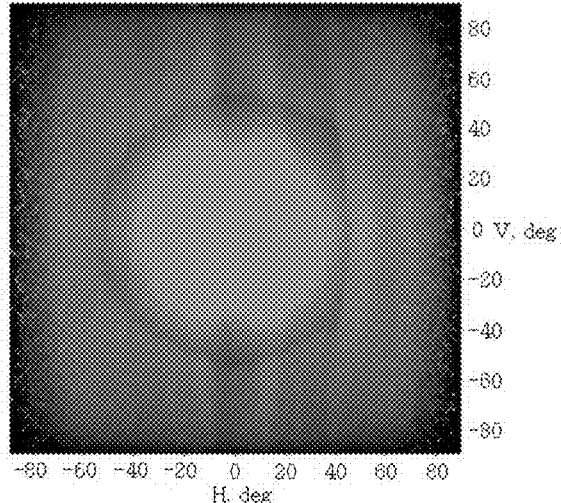
Figure 8C:
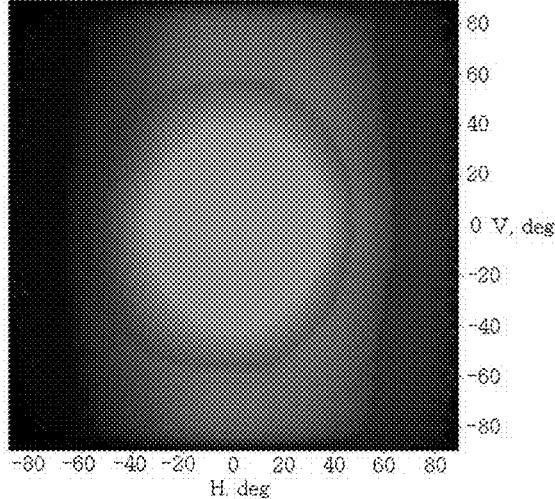
Figure 8D:
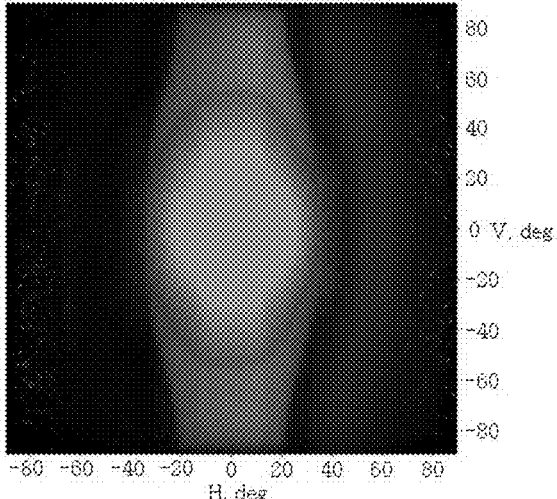

FIGS. 8A to 8D are views showing simulation results of emission characteristics with respect to viewing angles of organic light-emitting diode display devices according to embodiments of the present disclosure and comparison examples, showing green light as an example. FIGS. 8A and 8B show simulation results of the first and second embodiments, respectively, and FIGS. 8C and 8D show simulation results of the first and second comparison examples, respectively. Here, the display device of the first comparison example includes only a color filter without an abnormal emission reduction configuration such as a black matrix, and the display device of the second comparison example includes a color filter and a lens without an abnormal emission reduction configuration such as a black matrix.

In the first embodiment of FIG. 8A and the second embodiment of FIG. 8B, it can be seen that red light and blue light does not appear as the viewing angle increase to the right or left with respect to the front. Particularly, in the first embodiment, the uniformity according to the viewing angle is improved due to the light absorption layer 170 or 270. In the second embodiment, the efficiency in the emission area EA is improved by the convex lens portion 382, and asymmetry according to the viewing angle is improved.

On the other hand, in the first comparison example of FIG. 8C and the second comparison example of FIG. 8D, it can be seen that red light appears as the viewing angle increases to the right and blue light appears as the viewing angle increases to the left. Accordingly, asymmetry occurs according to the viewing angle.

As described above, in the present disclosure, by providing the abnormal emission reduction configuration such as the concave lens portion 184 or 384 having the high refractive index and/or the light absorption layer 170 or 270, the abnormal emission in the non-emission area can be reduced or minimized, so that the asymmetry according to the viewing angle can be improved and the uniformity can be increased.

The organic light-emitting diode display device according to the embodiment of the present disclosure can be applied to a head mounted display. A head mounted display is a virtual reality (VR) or augmented reality (AR) glasses-type monitor device that is worn in the form of glasses or a helmet and focuses on a distance close to the user's eyes. It can be implemented by arranging various optical systems on the front surface of the organic light-emitting diode display device according to the embodiment of the present disclosure.

In the present disclosure, the lateral leakage current between adjacent sub-pixels can be reduced or minimized by disposing the trench between the adjacent sub-pixels of different colors.

In addition, by disposing the convex lens portion having a relatively high refractive index over each color filter, the light efficiency can be improved and the luminance can be increased by the light-condensing effect. Accordingly, it is possible to lower the power consumption through the improved efficiency, thereby reducing the power consumption.

Moreover, by providing the concave portion between the adjacent color filters and the concave lens portion having a relatively high refractive index over the concave portion, the abnormal emission in the non-emission area can be reduced or minimized. According, since the color shift according to the viewing angle can be prevented, the viewing angle can be improved, and the color reproducibility can be increased.

Further, by further providing the light absorption layer corresponding to the concave portion, the abnormal emission in the non-emission area can be blocked, so that the color reproducibility can be further improved.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting diode display device, comprising:
   a substrate having a plurality of sub-pixels;
   a light-emitting diode disposed in each of the plurality of sub-pixels over the substrate;
   a color filter over the light-emitting diode;
   a lens layer over the color filter;
   an overcoat layer over the lens layer; and
   a concave portion positioned between adjacent color filters, and
   wherein the lens layer includes a convex lens portion over the color filter and a concave lens portion over the concave portion.

2. The organic light-emitting diode display device of claim 1, wherein the color filter has a curved side surface, and the concave portion is implemented by the curved side surface.

3. The organic light-emitting diode display device of claim 1, wherein an upper surface of the concave lens portion adjacent to the color filter is substantially flush with an upper surface of the color filter.

4. The organic light-emitting diode display device of claim 1, wherein a refractive index of the lens layer is equal to or greater than a refractive index of the color filter and greater than a refractive index of the overcoat layer.

5. The organic light-emitting diode display device of claim 1, further comprising a light absorption layer over the concave portion.

6. The organic light-emitting diode display device of claim 5, wherein the light absorption layer is disposed between the color filter and the lens layer.

7. The organic light-emitting diode display device of claim 5, wherein the light absorption layer is disposed between the lens layer and the overcoat layer.

8. The organic light-emitting diode display device of claim 5, wherein the light absorption layer is formed of chromium (Cr), titanium (Ti), molybdenum (Mo), cobalt (Co), nickel (Ni), or an alloy thereof.

9. A method of manufacturing an organic light-emitting diode display device, comprising:

forming a light-emitting diode at each of a plurality of sub-pixels provided over a substrate;

forming a color filter over the light-emitting diode;

forming a lens layer over the color filter; and forming an overcoat layer over the lens layer, wherein forming the color filter includes forming a concave portion between adjacent color filters, and wherein forming the lens layer includes forming a convex lens portion over the color filter and forming a concave lens portion over the concave portion.

10. The method of claim 9, wherein forming the color filter comprises:

forming a color resist layer over the light-emitting diode;

forming a color resist pattern by light-exposing and developing the color resist layer; and first curing the color resist pattern to thereby form the color filter having a curved side surface.

11. The method of claim 10, wherein forming the lens layer comprises:

forming an organic layer over the color filter;

forming an organic pattern by light-exposing and developing the organic layer; and second curing the organic pattern to thereby form the convex lens portion and the concave lens portion, wherein the second curing is performed at a higher temperature for a longer time than the first curing.

12. The method of claim 9, wherein forming the convex lens portion is performed after forming the concave lens portion.

13. The method of claim 9, further comprising:

forming a light absorption layer corresponding to the concave portion between forming the color filter and forming the overcoat layer.

14. A display device, comprising:

a plurality of sub-pixels on a substrate;

a light-emitting diode disposed at each of the plurality of sub-pixels;

a color filter layer including a plurality of grooves, the color filter layer having a first color filter of a first color, a second color filter of a second color, and a third color filter of a third color, the color filter layer on the light-emitting diode, a first groove of the plurality of groves between the first color filter and the second color filter, a second groove of the plurality of groves between the third color filter and the second color filter, and a lens layer on the color filter layer, the lens layer including a plurality of ridges and a plurality of valleys, the plurality of ridges including a first ridge, a second ridge, and a third ridge, the plurality of valleys including a first valley and a second valley, the first valley between the first ridge and the second ridge, the second valley between the second ridge and the third ridge, wherein the first valley of the lens layer overlaps with the first groove of the color filter layer from a plan view, and wherein the second valley of the lens layer overlaps with the second groove of the color filter layer from a plan view.

15. The display device of claim 14, comprising:

a trench between adjacent sub-pixels of the plurality of sub-pixels, wherein the first valley of the lens layer overlaps with the trench from a plan view.

16. The display device of claim 14, comprising:

a light absorption layer on the first valley of the lens layer, wherein a thickness of the light absorption layer gradually increases as the light absorption layer approaches a center of the first valley of the lens layer.

17. The display device of claim 14, comprising:

a light absorption layer on the first groove of the color filter layer.

18. The display device of claim 17, wherein the light absorption layer is between the first valley of the lens layer and the first groove of the color filter layer.

19. The display device of claim 18, wherein a thickness of the light absorption layer gradually increases as the light absorption layer approaches a center of the first groove of the color filter layer.

20. The display device of claim 14, wherein the first ridge of the lens layer overlaps with a light-emitting diode disposed below the first color filter of the color filter layer from a plan view.

21. The display device of claim 14, wherein the first color filter includes a first surface and a second surface opposite the first surface, and the second color filter includes a third surface and the second surface, the third surface adjacent to the first surface and spaced apart from the first surface, wherein the first groove is between the first surface of the first color filter and the third surface of the second color filter, wherein the first ridge of the lens layer is disposed above the first surface of the color filter, and wherein the first valley of the lens layer extends towards the first groove so as to be disposed below the first surface of the color filter.

22. The display device of claim 21, comprising a light absorption layer, wherein the light absorption layer is disposed on the first groove and is between the first surface of the first color filter and the third surface of the second color filter.

23. The display device of claim 21, comprising a light absorption layer, wherein the light absorption layer is disposed on the first valley, wherein the light absorption layer includes a portion that extends below the first surface of the first color filter and another portion that extends above the first surface of the first color filter.

* * * * *